United States Patent
Ma et al.

(10) Patent No.: US 7,659,158 B2
(45) Date of Patent: Feb. 9, 2010

(54) ATOMIC LAYER DEPOSITION PROCESSES FOR NON-VOLATILE MEMORY DEVICES

(75) Inventors: Yi Ma, Santa Clara, CA (US); Shreyas S. Kher, Campbell, CA (US); Khaled Ahmed, Anaheim, CA (US); Tejal Goyani, Sunnyvale, CA (US); Maitreyee Mahajani, Saratoga, CA (US); Jallepally Ravi, Santa Clara, CA (US); Yi-Chiau Huang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 18 days.

(21) Appl. No.: 12/059,782

(22) Filed: Mar. 31, 2008

(65) Prior Publication Data

US 2009/0242957 A1    Oct. 1, 2009

(51) Int. Cl.
*H01L 21/8238* (2006.01)
*H01L 29/788* (2006.01)

(52) U.S. Cl. .................. 438/201; 438/211; 257/315; 257/E21.179; 257/E29.123

(58) Field of Classification Search ............. 438/201, 438/211, 257, 593; 257/315, 321, 324, E29.123, 257/E29.3, E21.179, E21.422, E21.68
See application file for complete search history.

(56) References Cited

U.S. PATENT DOCUMENTS

| | | | |
|---|---|---|---|
| 3,574,677 A | 4/1971 | Pammer et al. | |
| 4,389,973 A | 6/1983 | Suntola et al. | |
| 4,413,022 A | 11/1983 | Suntola et al. | |
| 4,486,487 A | 12/1984 | Skarp et al. | |
| 4,693,208 A | 9/1987 | Sakai et al. | |
| 5,290,609 A | 3/1994 | Horiike et al. | |
| 5,306,666 A | 4/1994 | Izumi et al. | |

(Continued)

FOREIGN PATENT DOCUMENTS

EP        0464515        1/1992

(Continued)

OTHER PUBLICATIONS

Argarwal, et al. "Challenges in Integrating the High-K Gate Dielectric Film to the Conventional CMOS Process Flow," Mat. Sec. Soc. Sump. Proc. vol. 670 (2001).

(Continued)

*Primary Examiner*—Hoai v Pham
(74) *Attorney, Agent, or Firm*—Patterson & Sheridan, LLP

(57) ABSTRACT

Embodiments of the invention provide memory devices and methods for forming memory devices. In one embodiment, a memory device is provided which includes a floating gate polysilicon layer disposed over source/drain regions of a substrate, a silicon oxynitride layer disposed over the floating gate polysilicon layer, a first aluminum oxide layer disposed over the silicon oxynitride layer, a hafnium silicon oxynitride layer disposed over the first aluminum oxide layer, a second aluminum oxide layer disposed over the hafnium silicon oxynitride layer, and a control gate polysilicon layer disposed over the second aluminum oxide layer. In another embodiment, a memory device is provided which includes a control gate polysilicon layer disposed over an inter-poly dielectric stack disposed over a silicon oxide layer disposed over the floating gate polysilicon layer. The inter-poly dielectric stack contains two silicon oxynitride layers separated by a silicon nitride layer.

14 Claims, 10 Drawing Sheets

U.S. PATENT DOCUMENTS

| | | |
|---|---|---|
| 5,374,570 A | 12/1994 | Nasu et al. |
| 5,480,818 A | 1/1996 | Matsumoto et al. |
| 5,483,919 A | 1/1996 | Yokoyama et al. |
| 5,503,875 A | 4/1996 | Imai et al. |
| 5,521,126 A | 5/1996 | Okamura et al. |
| 5,807,792 A | 9/1998 | Ilg et al. |
| 5,855,680 A | 1/1999 | Soininen et al. |
| 5,916,365 A | 6/1999 | Sherman |
| 5,923,056 A | 7/1999 | Lee et al. |
| 6,001,420 A | 12/1999 | Mosely et al. |
| 6,013,553 A | 1/2000 | Wallace et al. |
| 6,015,590 A | 1/2000 | Suntola et al. |
| 6,020,243 A | 2/2000 | Wallace et al. |
| 6,025,627 A | 2/2000 | Forbes et al. |
| 6,043,177 A | 3/2000 | Falconer et al. |
| 6,060,755 A | 5/2000 | Ma et al. |
| 6,124,158 A | 9/2000 | Dautartas et al. |
| 6,143,659 A | 11/2000 | Leem et al. |
| 6,144,060 A | 11/2000 | Park et al. |
| 6,174,809 B1 | 1/2001 | Kang et al. |
| 6,200,893 B1 | 3/2001 | Sneh |
| 6,203,613 B1 | 3/2001 | Gates et al. |
| 6,207,302 B1 | 3/2001 | Sugiura et al. |
| 6,207,487 B1 | 3/2001 | Kim et al. |
| 6,238,734 B1 | 5/2001 | Senzaki et al. |
| 6,251,802 B1 | 6/2001 | Moore et al. |
| 6,270,572 B1 | 8/2001 | Kim et al. |
| 6,284,646 B1 | 9/2001 | Leem et al. |
| 6,287,965 B1 | 9/2001 | Kang et al. |
| 6,291,283 B1 | 9/2001 | Wilk |
| 6,291,867 B1 | 9/2001 | Wallace et al. |
| 6,297,172 B1 | 10/2001 | Kashiwagi et al. |
| 6,297,539 B1 | 10/2001 | Ma et al. |
| 6,299,294 B1 | 10/2001 | Regan |
| 6,305,314 B1 | 10/2001 | Sneh et al. |
| 6,335,240 B1 | 1/2002 | Kim et al. |
| 6,342,277 B1 | 1/2002 | Sherman |
| 6,348,386 B1 | 2/2002 | Gilmer |
| 6,358,829 B2 | 3/2002 | Yoon et al. |
| 6,372,598 B2 | 4/2002 | Kang et al. |
| 6,391,785 B1 | 5/2002 | Satta et al. |
| 6,391,803 B1 | 5/2002 | Kim et al. |
| 6,395,650 B1 | 5/2002 | Callegari et al. |
| 6,399,208 B1 | 6/2002 | Baum et al. |
| 6,399,491 B2 | 6/2002 | Jeon et al. |
| 6,416,577 B1 | 7/2002 | Suntoloa et al. |
| 6,420,279 B1 | 7/2002 | Ono et al. |
| 6,451,119 B2 | 9/2002 | Sneh et al. |
| 6,451,695 B2 | 9/2002 | Sneh |
| 6,452,229 B1 | 9/2002 | Krivokapic |
| 6,462,367 B2 | 10/2002 | Marsh et al. |
| 6,468,924 B2 | 10/2002 | Lee et al. |
| 6,475,276 B1 | 11/2002 | Elers et al. |
| 6,475,910 B1 | 11/2002 | Sneh |
| 6,482,262 B1 | 11/2002 | Elers et al. |
| 6,489,214 B2 | 12/2002 | Kim et al. |
| 6,492,283 B2 | 12/2002 | Raaijmakers et al. |
| 6,511,539 B1 | 1/2003 | Raaijmakers et al. |
| 6,534,395 B2 | 3/2003 | Werkhoven et al. |
| 6,599,572 B2 | 7/2003 | Saanila et al. |
| 6,607,973 B1 | 8/2003 | Jeon |
| 6,613,383 B1 | 9/2003 | George et al. |
| 6,620,670 B2 | 9/2003 | Song et al. |
| 6,620,723 B1 | 9/2003 | Byun et al. |
| 6,630,413 B2 | 10/2003 | Todd |
| 6,632,279 B1 | 10/2003 | Ritala et al. |
| 6,632,747 B2 | 10/2003 | Niimi et al. |
| 6,660,659 B1 | 12/2003 | Kraus et al. |
| 6,660,660 B2 | 12/2003 | Haukka et al. |
| 6,674,138 B1 | 1/2004 | Halliyal et al. |
| 6,677,247 B2 | 1/2004 | Yuan et al. |
| 6,713,177 B2 | 3/2004 | George et al. |
| 6,713,846 B1 | 3/2004 | Senzaki |
| 6,773,507 B2 | 8/2004 | Jallepally et al. |
| 6,777,352 B2 | 8/2004 | Tepman et al. |
| 6,803,272 B1 | 10/2004 | Halliyal et al. |
| 6,815,285 B2 | 11/2004 | Choi et al. |
| 6,818,250 B2 | 11/2004 | George et al. |
| 6,825,134 B2 | 11/2004 | Law et al. |
| 6,831,004 B2 | 12/2004 | Byun et al. |
| 6,831,021 B2 | 12/2004 | Chua et al. |
| 6,846,516 B2 | 1/2005 | Yang et al. |
| 6,858,547 B2 | 2/2005 | Metzner et al. |
| 6,861,356 B2 | 3/2005 | Matsuse et al. |
| 6,869,838 B2 | 3/2005 | Law et al. |
| 6,897,106 B2 | 5/2005 | Park et al. |
| 6,905,939 B2 | 6/2005 | Yuan et al. |
| 6,913,827 B2 | 7/2005 | George et al. |
| 6,924,191 B2 | 8/2005 | Liu et al. |
| 6,930,060 B2 | 8/2005 | Chou et al. |
| 6,969,539 B2 | 11/2005 | Gordon et al. |
| 6,992,019 B2 | 1/2006 | Lee et al. |
| 7,001,814 B1 * | 2/2006 | Halliyal et al. ............... 438/287 |
| 7,005,697 B2 | 2/2006 | Batra et al. |
| 7,067,439 B2 | 6/2006 | Metzner et al. |
| 7,175,713 B2 | 2/2007 | Thakur et al. |
| 7,208,413 B2 | 4/2007 | Byun et al. |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0021589 A1 | 9/2001 | Wilk |
| 2001/0024387 A1 | 9/2001 | Raaijmakers et al. |
| 2001/0024871 A1 | 9/2001 | Yagi |
| 2001/0028924 A1 | 10/2001 | Sherman |
| 2001/0029092 A1 | 10/2001 | Park et al. |
| 2001/0029891 A1 | 10/2001 | Oh et al. |
| 2001/0034123 A1 | 10/2001 | Jeon et al. |
| 2001/0041250 A1 | 11/2001 | Werkhoven et al. |
| 2001/0050039 A1 | 12/2001 | Park |
| 2001/0054730 A1 | 12/2001 | Kim et al. |
| 2002/0000598 A1 | 1/2002 | Kang et al. |
| 2002/0005556 A1 | 1/2002 | Cartier et al. |
| 2002/0007790 A1 | 1/2002 | Park |
| 2002/0008297 A1 | 1/2002 | Park et al. |
| 2002/0014647 A1 | 2/2002 | Seidl et al. |
| 2002/0015790 A1 | 2/2002 | Baum et al. |
| 2002/0016084 A1 | 2/2002 | Todd |
| 2002/0021544 A1 | 2/2002 | Cho et al. |
| 2002/0029092 A1 | 3/2002 | Gass |
| 2002/0031618 A1 | 3/2002 | Sherman |
| 2002/0043666 A1 | 4/2002 | Parsons et al. |
| 2002/0047151 A1 | 4/2002 | Kim et al. |
| 2002/0048635 A1 | 4/2002 | Kim et al. |
| 2002/0052097 A1 | 5/2002 | Park |
| 2002/0060363 A1 | 5/2002 | Xi et al. |
| 2002/0064970 A1 | 5/2002 | Chooi et al. |
| 2002/0074588 A1 | 6/2002 | Lee |
| 2002/0076837 A1 | 6/2002 | Hujanen et al. |
| 2002/0081826 A1 | 6/2002 | Rotondaro et al. |
| 2002/0081844 A1 | 6/2002 | Jeon et al. |
| 2002/0086111 A1 | 7/2002 | Byun et al. |
| 2002/0086507 A1 | 7/2002 | Park et al. |
| 2002/0090835 A1 | 7/2002 | Chakravarti et al. |
| 2002/0093046 A1 | 7/2002 | Moriya et al. |
| 2002/0093781 A1 | 7/2002 | Bachhofer et al. |
| 2002/0094689 A1 | 7/2002 | Park |
| 2002/0098627 A1 | 7/2002 | Pomarede et al. |
| 2002/0106451 A1 | 8/2002 | Skarp et al. |
| 2002/0106536 A1 | 8/2002 | Lee et al. |
| 2002/0115252 A1 | 8/2002 | Haukka et al. |
| 2002/0117399 A1 | 8/2002 | Chen et al. |
| 2002/0127883 A1 | 9/2002 | Conti et al. |
| 2002/0146895 A1 | 10/2002 | Ramdani et al. |

| | | |
|---|---|---|
| 2002/0151152 A1 | 10/2002 | Shimamoto et al. |
| 2002/0153579 A1 | 10/2002 | Yamamoto |
| 2002/0155722 A1 | 10/2002 | Satta et al. |
| 2002/0162506 A1 | 11/2002 | Sneh et al. |
| 2002/0172768 A1 | 11/2002 | Endo et al. |
| 2002/0173130 A1 | 11/2002 | Pomerede et al. |
| 2002/0175393 A1 | 11/2002 | Baum et al. |
| 2002/0177282 A1 | 11/2002 | Song |
| 2002/0180028 A1 | 12/2002 | Borovik et al. |
| 2002/0182320 A1 | 12/2002 | Leskela et al. |
| 2002/0187256 A1 | 12/2002 | Elers et al. |
| 2002/0187631 A1 | 12/2002 | Kim et al. |
| 2002/0195643 A1 | 12/2002 | Harada |
| 2002/0196591 A1 | 12/2002 | Hujanen et al. |
| 2002/0197856 A1 | 12/2002 | Matsuse et al. |
| 2002/0197881 A1 | 12/2002 | Ramdani et al. |
| 2002/0197883 A1 | 12/2002 | Niimi et al. |
| 2003/0013320 A1 | 1/2003 | Kim et al. |
| 2003/0015764 A1 | 1/2003 | Raaijmakers et al. |
| 2003/0031807 A1 | 2/2003 | Elers et al. |
| 2003/0032281 A1 | 2/2003 | Werkhoven et al. |
| 2003/0049931 A1 | 3/2003 | Byun et al. |
| 2003/0049942 A1 | 3/2003 | Haukka et al. |
| 2003/0059535 A1 | 3/2003 | Luo et al. |
| 2003/0060057 A1 | 3/2003 | Raaijmakers et al. |
| 2003/0068437 A1 | 4/2003 | Nakamura et al. |
| 2003/0072884 A1 | 4/2003 | Zhang et al. |
| 2003/0072975 A1 | 4/2003 | Shero et al. |
| 2003/0082296 A1 | 5/2003 | Elers et al. |
| 2003/0082301 A1 | 5/2003 | Chen et al. |
| 2003/0089308 A1 | 5/2003 | Raaijmakers |
| 2003/0089942 A1 | 5/2003 | Bhattacharyya |
| 2003/0096473 A1 | 5/2003 | Shih et al. |
| 2003/0101927 A1 | 6/2003 | Raaijmakers |
| 2003/0104707 A1 | 6/2003 | Senzaki et al. |
| 2003/0104710 A1 | 6/2003 | Visokay et al. |
| 2003/0106490 A1 | 6/2003 | Jallepally et al. |
| 2003/0108674 A1 | 6/2003 | Chung et al. |
| 2003/0109114 A1 | 6/2003 | Niwa |
| 2003/0116804 A1 | 6/2003 | Visokay et al. |
| 2003/0124262 A1 | 7/2003 | Chen et al. |
| 2003/0127427 A1 | 7/2003 | Yuan et al. |
| 2003/0129826 A1 | 7/2003 | Werkhoven et al. |
| 2003/0133861 A1 | 7/2003 | Bowen et al. |
| 2003/0139005 A1 | 7/2003 | Song et al. |
| 2003/0143841 A1 | 7/2003 | Yang et al. |
| 2003/0153177 A1 | 8/2003 | Tepman et al. |
| 2003/0160277 A1 | 8/2003 | Bhattacharyya |
| 2003/0161951 A1 | 8/2003 | Yuan et al. |
| 2003/0165615 A1 | 9/2003 | Aaltonen et al. |
| 2003/0166318 A1 | 9/2003 | Zheng et al. |
| 2003/0168750 A1 | 9/2003 | Basceri et al. |
| 2003/0172872 A1 | 9/2003 | Thakur et al. |
| 2003/0173586 A1 | 9/2003 | Moriwaki et al. |
| 2003/0185980 A1 | 10/2003 | Endo |
| 2003/0186495 A1 | 10/2003 | Saanila et al. |
| 2003/0186561 A1 | 10/2003 | Law et al. |
| 2003/0188682 A1 | 10/2003 | Tois et al. |
| 2003/0189232 A1 | 10/2003 | Law et al. |
| 2003/0190423 A1 | 10/2003 | Yang et al. |
| 2003/0190497 A1 | 10/2003 | Yang et al. |
| 2003/0194825 A1 | 10/2003 | Law et al. |
| 2003/0194853 A1 | 10/2003 | Jeon |
| 2003/0198754 A1 | 10/2003 | Xi et al. |
| 2003/0205729 A1 | 11/2003 | Basceri et al. |
| 2003/0213560 A1 | 11/2003 | Wang et al. |
| 2003/0213987 A1 | 11/2003 | Basceri et al. |
| 2003/0215570 A1 | 11/2003 | Seutter et al. |
| 2003/0216981 A1 | 11/2003 | Tillman |
| 2003/0219942 A1 | 11/2003 | Choi et al. |
| 2003/0227033 A1 | 12/2003 | Ahn et al. |
| 2003/0232501 A1 | 12/2003 | Kher et al. |
| 2003/0232506 A1 | 12/2003 | Metzner et al. |
| 2003/0232511 A1 | 12/2003 | Metzner et al. |
| 2003/0232513 A1 | 12/2003 | Kraus et al. |
| 2003/0232554 A1 | 12/2003 | Blum et al. |
| 2003/0234417 A1 | 12/2003 | Raaijmakers et al. |
| 2003/0235961 A1 | 12/2003 | Metzner et al. |
| 2004/0005749 A1 | 1/2004 | Choi et al. |
| 2004/0007747 A1 | 1/2004 | Visokay et al. |
| 2004/0009307 A1 | 1/2004 | Koh et al. |
| 2004/0009675 A1 | 1/2004 | Eissa et al. |
| 2004/0016973 A1 | 1/2004 | Rotondaro et al. |
| 2004/0018723 A1 | 1/2004 | Byun et al. |
| 2004/0018738 A1 | 1/2004 | Liu |
| 2004/0018747 A1 | 1/2004 | Lee et al. |
| 2004/0023461 A1 | 2/2004 | Ahn et al. |
| 2004/0023462 A1 | 2/2004 | Rotondaro et al. |
| 2004/0028952 A1 | 2/2004 | Cartier et al. |
| 2004/0029321 A1 | 2/2004 | Ang et al. |
| 2004/0033698 A1 | 2/2004 | Lee et al. |
| 2004/0036111 A1 | 2/2004 | Nishikawa et al. |
| 2004/0038486 A1 | 2/2004 | Chua et al. |
| 2004/0038554 A1 | 2/2004 | Ahn et al. |
| 2004/0040501 A1 | 3/2004 | Vaartstra |
| 2004/0043149 A1 | 3/2004 | Gordon et al. |
| 2004/0043569 A1 | 3/2004 | Ahn et al. |
| 2004/0043623 A1 | 3/2004 | Liu et al. |
| 2004/0043630 A1 | 3/2004 | Vaartstra et al. |
| 2004/0046197 A1 | 3/2004 | Basceri et al. |
| 2004/0048491 A1 | 3/2004 | Jung et al. |
| 2004/0051152 A1 | 3/2004 | Nakajima |
| 2004/0053484 A1 | 3/2004 | Kumar et al. |
| 2004/0077182 A1 | 4/2004 | Lim et al. |
| 2004/0121085 A1 | 6/2004 | Wang et al. |
| 2004/0157391 A1 | 8/2004 | Park et al. |
| 2004/0175961 A1 | 9/2004 | Olsen |
| 2004/0194691 A1 | 10/2004 | George et al. |
| 2004/0198069 A1 | 10/2004 | Metzner et al. |
| 2004/0203254 A1 | 10/2004 | Conley et al. |
| 2004/0214354 A1 | 10/2004 | Marsh et al. |
| 2004/0216670 A1 | 11/2004 | Gutsche et al. |
| 2004/0224089 A1 | 11/2004 | Singh et al. |
| 2004/0235285 A1 | 11/2004 | Kang et al. |
| 2004/0256664 A1 | 12/2004 | Chou et al. |
| 2005/0006799 A1 | 1/2005 | Gregg et al. |
| 2005/0008779 A1 | 1/2005 | Yang et al. |
| 2005/0009371 A1 | 1/2005 | Metzner et al. |
| 2005/0012975 A1 | 1/2005 | George et al. |
| 2005/0037627 A1 | 2/2005 | Dussarrat et al. |
| 2005/0064207 A1 | 3/2005 | Senzaki et al. |
| 2005/0070126 A1 | 3/2005 | Senzaki |
| 2005/0118804 A1 | 6/2005 | Byun et al. |
| 2005/0130438 A1 | 6/2005 | Rotondaro et al. |
| 2005/0153571 A1 | 7/2005 | Senzaki |
| 2005/0170604 A1 | 8/2005 | Orlowski et al. |
| 2005/0233156 A1 | 10/2005 | Senzaki et al. |
| 2005/0252449 A1 | 11/2005 | Nguyen et al. |
| 2005/0255243 A1 | 11/2005 | Senzaki |
| 2005/0260347 A1 | 11/2005 | Narwankar et al. |
| 2005/0260357 A1 | 11/2005 | Olsen et al. |
| 2005/0271812 A1 | 12/2005 | Myo et al. |
| 2005/0271813 A1 | 12/2005 | Kher et al. |
| 2006/0019032 A1 | 1/2006 | Wang et al. |
| 2006/0019033 A1 | 1/2006 | Muthukrishnan et al. |
| 2006/0062917 A1 | 3/2006 | Muthukrishnan et al. |
| 2006/0084283 A1 | 4/2006 | Paranjpe et al. |
| 2006/0153995 A1 | 7/2006 | Narwankar et al. |
| 2006/0156979 A1 | 7/2006 | Thakur et al. |
| 2006/0178018 A1 | 8/2006 | Olsen |
| 2006/0208215 A1 | 9/2006 | Metzner et al. |
| 2006/0223339 A1 | 10/2006 | Metzner et al. |
| 2006/0264067 A1 | 11/2006 | Kher et al. |
| 2006/0286774 A1 | 12/2006 | Singh et al. |
| 2006/0286775 A1 | 12/2006 | Singh et al. |
| 2006/0286776 A1 | 12/2006 | Ranish et al. |

| | | | |
|---|---|---|---|
| 2006/0286818 | A1 | 12/2006 | Wang et al. |
| 2006/0286819 | A1 | 12/2006 | Seutter et al. |
| 2006/0286820 | A1 | 12/2006 | Singh et al. |
| 2007/0003698 | A1 | 1/2007 | Chen et al. |
| 2007/0020890 | A1 | 1/2007 | Thakur et al. |
| 2007/0026147 | A1 | 2/2007 | Chen et al. |
| 2007/0049043 | A1 | 3/2007 | Muthukrishnan et al. |
| 2007/0049053 | A1 | 3/2007 | Mahajani |
| 2007/0059948 | A1 | 3/2007 | Metzner et al. |
| 2007/0065578 | A1 | 3/2007 | McDougall |
| 2007/0095285 | A1 | 5/2007 | Thakur et al. |

FOREIGN PATENT DOCUMENTS

| | | |
|---|---|---|
| EP | 0973189 | 1/2000 |
| EP | 0973191 | 1/2000 |
| EP | 1146141 | 10/2001 |
| EP | 1167569 | 1/2002 |
| EP | 1170804 | 1/2002 |
| EP | 1321973 | 6/2003 |
| GB | 2355727 | 5/2001 |
| JP | 64082671 | 3/1989 |
| JP | 01143221 | 6/1989 |
| JP | 02014513 | 1/1990 |
| JP | 02230690 | 9/1990 |
| JP | 02246161 | 10/1990 |
| JP | 03234025 | 10/1991 |
| JP | 05029228 | 2/1993 |
| JP | 05074724 | 3/1993 |
| JP | 05251339 | 9/1993 |
| JP | 06177381 | 6/1994 |
| JP | 06196809 | 7/1994 |
| JP | 06230421 | 8/1994 |
| JP | 07086269 | 3/1995 |
| JP | 07300649 | 11/1995 |
| JP | 10308283 | 11/1998 |
| JP | 11269652 | 10/1999 |
| JP | 2000031387 | 1/2000 |
| JP | 2000058777 | 2/2000 |
| JP | 2001111000 | 4/2001 |
| JP | 2001172767 | 6/2001 |
| JP | 2001220294 | 8/2001 |
| JP | 2001328900 | 11/2001 |
| JP | 2002060944 | 2/2002 |
| JP | 2002069641 | 3/2002 |
| JP | 2002093804 | 3/2002 |
| JP | 2002167672 | 6/2002 |
| JP | 2002172767 | 6/2002 |
| WO | WO-9929924 | 6/1999 |
| WO | WO-0013235 | 3/2000 |
| WO | WO-0016377 | 3/2000 |
| WO | WO-0054320 | 9/2000 |
| WO | WO-0070674 | 11/2000 |
| WO | WO-0115220 | 3/2001 |
| WO | WO-0117692 | 3/2001 |
| WO | WO-0125502 | 4/2001 |
| WO | WO-0127346 | 4/2001 |
| WO | WO-0127347 | 4/2001 |
| WO | WO-0129280 | 4/2001 |
| WO | WO-0129891 | 4/2001 |
| WO | WO-0129893 | 4/2001 |
| WO | WO-0140541 | 6/2001 |
| WO | WO-0166832 | 9/2001 |
| WO | WO-0182390 | 11/2001 |
| WO | WO-0199166 | 12/2001 |
| WO | WO-0201628 | 1/2002 |
| WO | WO-0209167 | 1/2002 |
| WO | WO-0227063 | 4/2002 |
| WO | WO-0231875 | 4/2002 |
| WO | WO-0243115 | 5/2002 |
| WO | WO-0245167 | 6/2002 |
| WO | WO-02065525 | 8/2002 |
| WO | WO-02067319 | 8/2002 |
| WO | WO-2004010471 | 1/2004 |

OTHER PUBLICATIONS

Balog, et al. "Chemical Vapor Deposition and Characterization of $HfO_2$ Films from Organo-Hafnium Compounds," Thin Solid Films, 41 (1977) 247-259.

Bedair, "Atomic Layer Epitaxy Deposition Processes," J. Vac. Sci. Technol. B., vol. 12, No. 1, Jan./Feb. 1994.

Cameron, et al. "Atomic Layer Deposition of $SiO_2$ and $TiO_2$ in Alumina Tubular Membranes," Langmuir, vol. 16, No. 19, American Chemical Society, 2000, pp. 7435.

Chatham, Hood; et al. "Nitridation of Hafnium Silicate Thin Films", Mat. Res. Soc. Symp. Proc. vol. 811, Apr. 12-16, 2004, D7.5.1.

Cheon, et al. "Gas Phase Photoproduction of Diatomic Metal Nitrides During Metal Nitride Laser Chemical Vapor Deposition," Inorg. Chem. 1999, 38, 2238-2239.

Choi, et al. "Stability of $TiB_2$ as a Diffusion Barrier on Silicon," J. Electrochem. Soc., vol. 138, No. 10, Oct. 1991, pp. 3062-3067.

Choi, et al. "The Effect of Annealing on Resistivity of Low Pressure Chemical Vapor Deposited Titanium Diboride," J. Appl. Phys. 69(11), Jun. 1, 1991, pp. 7853-7861.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Conley, J.F.; et al. "Interval Annealing During Alternating Pulse Deposition", Mat. Res. Soc. Symp. Proc. vol. 811, Apr. 12-16, 2004, D1.3.1.

Derbyshire "Applications of Integrated Processing," Solid State Technology, Dec. 1994, pp. 45-48.

Dey, et al. "Ruthenium films by digital chemical vapor deposition: Selectivity, nanostructure, and work function," Applied Physics Letter, vol. 84, No. 9, Mar. 1, 2004, American Institute of Physics, pp. 1606.

Du, et al. "$SiO_2$ Film Growth at Low Temperature by Catalyzed Atomic Layer Deposition in a Viscous Flow Reactor," Thin Solid Films, 491, (2005), pp. 43-53.

Elam, et al. "Nucleation and Growth During Tungsten Atomic Layer Deposition on $SiO_2$ Surfaces," Thin Solid Films, 386, (2001), pp. 41-52.

Elers, et al. "$NbCl_5$ as a Precursor in Atomic Layer Epitaxy," Applied Surface Science 82/83 (1994), pp. 468-474.

Fabreguette, et al. "Ultrahigh x-ray reflectivity from $W/Al_2O_3$ multilayers fabricated using atomic layer deposition," Applied Physics Letter, 88, 2006, pp. 013116-1-013116-3.

Ferguson, et al. "ALD of $SiO_2$ at Room Temperature Using TEOS and $H_2O$ with $NH_3$ as the Catalyst," Journal of The Electrochemical Society, 151, (8), pp. G528-G535 (2004).

Ferguson, et al. "Atomic Layer Deposition of $Al_2O_3$ and $SiO_2$ on BN Particles Using Sequential Surface Reactions," Applied Surface Science, 162-163, (2000), pp. 280-292.

Ferguson, et al. "Atomic Layer Deposition of $SiO_2$ Films on BN Particles Using Sequential Surface Reactions," Chem. Mater., vol. 12, No. 11, 2000, pp. 3472.

George, et al. "Atomic Layer Controlled Deposition of $SiO_2$ and $Al_2O_3$ using ABAB . . . binary reaction sequence chemistry," Applied Surface Science 82/83 (1994) 460-467.

George, et al. "Surface Chemistry for Atomic Layer Growth," J. Phys. Chem. (1996), 100, 13121-13131.

Goto, et al. "Atomic layer controlled deposition of silicon nitride with self-limiting mechanism," Applied Physics Letters, American Institute of Physics. New York, US, vol. 68, No. 23, Jun. 3, 1996, pp. 3257-3259.

Groner, et al. "High-$k$ Dielectrics Grown by Atomic Layer Deposition: Capacitor and Gate Applications," Interlayer Dielectrics for Semiconductor Technologies, Chapter 10, Elsevier Inc., 2003, pp. 327-348.

Hausmann, et al. "Rapid Vapor Deposition of Highly Conformal Silica Nanolaminates," Science, vol. 298, Oct. 11, 2002, pp. 402-406.

He, et al. "Pulsed Deposition of Silicate Films," Journal of Applied Physics, vol. 94, No. 5, Sep. 1, 2003, pp. 3657-3659.

Hendrix, et al. "Composition control of $Hf_{1-x}Si_xO_2$ films deposited on Si by chemical-vapor deposition using amide precursors," Applied Physics Letters, American Institute of Physics. New York, US, vol. 80, No. 13, Apr. 1, 2002, pp. 2362-2364.

Ho, et al. "Suppressed crystallization of Hf-based gate dielectrics by controlled addition of $Al_2O_3$ using atomic layer deposition", Applied Physics Letters, American Institute of Physics, New York, US, vol. 81, No. 22, Nov. 25, 2002, pp. 4218-4220.

Hwang, et al. "Nanometer-Size $\alpha$-$PbO_2$-Type $TiO_2$ in Garnet: A Thermobarometer for Ultrahigh-Pressure Metamorphism," Science Vo. 288 (Apr. 14, 2000), pp. 321-324.

Jeong, et al. "Growth and Characterization of Aluminum Oxide ($Al_2O_3$) Thin Films by Plasma-Assisted Atomic Layer Controlled Deposition," J. Korean Inst. Met. Mater., vol. 38, No. 10, Oct. 2000 pp. 1395-1399.

Jeong, et al. "Plasma-assisted Atomic Layer Growth of High-Quality Aluminum Oxide Thin Films," Jpn. J. Appl. Phys. 1, vol. 40, No. 1, Jan. 2001 pp. 285-289.

Kamiyama, et al. "Improvement in the uniformity and the thermal stability of Hf-silicate gate dielectric by plasma-nitridation," Gate Insulator, 2003. IWGI 2003. Extended Abstracts of International Workshop on Nov. 6-7, 2003, Piscataway, NJ, USA, IEEE, Nov. 6, 2002, pp. 42-46.

Kang, et al. "Infrared Spectroscopic Study of Atomic Layer Deposition Mechanism for Hafnium Silicate Thin Films Using $HfCl_2$ $[N(SiMe_3)_2]_2$ and $H_2O$," J. Vac. Sci. Technol. A 22(6), Nov./Dec. 2004, American Vacuum Society, pp. 2393-2397.

Kattelus, et al. "Electrical Properties of Tantalum Based Composite Oxide Films," Mat. Res. Soc. Symp. Proc., 284 (1993) 511-516.

Kawahara, et al. "Effects of Hf sources, oxidizing agents, and $NH_3$ radicals on properties of $HfAlO_x$ films prepared by atomic layer deposition", IWGI 2003, Tokyo, Nov. 6, 2003, pp. 32-37.

Kim, et al. "Substrate dependence on the optical properties of $Al_2O_3$ films grown by atomic layer deposition," Applied. Phys. Lett. 71 (25), Dec. 22, 1997 (3604-6).

Klaus, et al. "Atomic Layer Controlled Growth of $SiO_2$ Films Using Binary Reaction Sequence Chemistry," Appl. Phys. Lett. 70(9), Mar. 3, 1997. pp. 1092-1094.

Klaus, et al. "Atomic Layer Deposition of $SiO_2$ at Room Temperature Using $NH_3$-Catalyzed Sequential Surface Reactions," Surface Science 447 (2000) Elsevier Science, pp. 81-90.

Klaus, et al. "Atomic Layer Deposition of $SiO_2$ Using Catalyzed and Uncatalyzed Self-Limiting Surface Reactions," Surface Review and Letters, vol. 6, Nos. 3 & 4 (1999), pp. 435-448.

Klaus, et al. "Growth of $SiO_2$ at Room Temperature with the Use of Catalyzed Sequential Half-Reactions," Science, vol. 278, Dec. 12, 1997, pp. 1934-1936.

Klaus, et al. "$SiO_2$ Chemical Vapor Deposition at Room Temperature Using $SiCl_4$ and $H_2O$ with an $NH_3$ Catalyst," Journal of The Electrochemical Society, 147 (7), 2000, pp. 2658-2664.

Kukli, et al. "Atomic Layer Deposition of Hafnium Dioxide Films from Hafnium Tetrakis(ethylmethylamide) and Water", Chemical Vapor Deposition, VCH Publishers, Weinheim, DE, vol. 8, No. 5, Sep. 2002, pp. 199-204.

Kukli, et al. "Tailoring the Dielectric Properties of $HfO_2$-$Ta_2O_5$ Nanolaminates," Applied Physics Letters, vol. 68, No. 26 (Jun. 24, 1996), pp. 3737-3739.

Lee, et al. "Cyclic Technique for the Enhancement of Highly Oriented Diamond Film Growth," Thin Solid Films 303 (1997) pp. 264-269.

McCool, et al. "Self-Limited Pore Size Reduction of Mesoporous Silica Membranes via Pyridine-Catalyzed Silicon Dioxide ALD," Chem. Vap. Dep., 2004, vol. 10, No. 4, pp. 190-194.

McCool "Synthesis and Characterization of Silica Membrane Prepared by Pyridine-Catalyzed Atomic Layer Deposition," Ind. Eng. Chem. Res., vol. 43, No. 10, 2004, pp. 2478-2484.

Min, et al. "Chemical Vapor Deposition of Ti-Si-N Films with Alternating Source Supply," Mat. Res. Soc. Symp. Proc. vol. 564 (1999) pp. 207-210.

Min, et al. "Metal-organic Atomic-layer Deposition of Titanium-silicon-nitride Films," Applied Physics Letters, vol. 75, No. 11 (Sep. 11, 1999) pp. 1521-1523.

Morishita, et al. "New Substances for Atomic-Layer Deposition of Silicon Dioxide," Journal of Non-Crystalline Solids, vol. 187 (1995) pp. 66-69.

Niinisto, et al. "Synthesis of Oxide Thin Films and Overlayers by Atomic Layer Epitaxy for Advanced Applications," Materials Science and Engineering B41 (1996) 23-29.

Ohshita, et al. "$Hf_{1-x}Si_xO_2$ deposition by metal organic chemical vapor deposition using the $Hf(NEt_2)_4/SiH(NEt_2)_3/O_2$ gas system", Preparation and Characterization, Elsevier Sequioa, NL, vol. 416, No. 1-2, Sep. 2, 2002, pp. 208-211.

Ohshita, et al. "$HfO_2$ Growth by Low-pressure Chemical Vapor Deposition Using the $Hf(N(C_2H_5)_2)_4/O_2$ Gas System," Journal of Crystal Growth 233 (2001) 292-297.

Paranjpe, et al. "Atomic Layer Deposition of $AlO_3$ for Thin Film Head Gap Applications," J. Elec. Soc., vol. 148, No. 9 Sep. 2001 pp. G465-471.

Rana, et al. "Interactions of Moisture and Organic Contaminants with $SiO_2$ and $ZrO_2$ Gate Dielectric Films," Applied Surface Science, vol. 205, (2003), pp. 160-175.

Ritala, et al. "Atomic Layer Deposition of Oxide Thin Films with Metal Alkoxides as Oxygen Sources," Science vol. 288, Apr. 14, 2000, pp. 319-321.

Ritala, et al. "Development of Crystallinity and Morphology in Hafnium Dioxide Thin Films Grown by Atomic Layer Epitaxy," Thin Solid Films, vol. 250, No. 1-2, (Oct. 1, 1994), p. 72-80.

Ritala, et al. "Perfectly Conformal TiN and $Al_2O_3$ Films Deposited by Atomic Layer Deposition," Chemical Vapor Deposition, Jan. 1999, 5, No. 1, pp. 6-9.

Ritala, et al. Ann. Acad. Sci. Fenn. Ser. A II. Chemica 257 (1994) 1-48.

Sekine, et al. "Nitrogen profile control by plasma nitridation technique for poly-Si gate HfSiON CMOSFET with excellent interface property and ultra-low leakage current," International Electron Devices Meeting 2003. IEDM. Technical Digest. Washington, DC, Dec. 8-10, 2003, New York, NY, IEEE, US, Dec. 8, 2003, pp. 103-106.

Senzaki, et al. "A Novel Atomic Layer Deposition Process to Deposit Hafnium Silicate Thin Films", Electrochemical Society Proceedings vol. 2004-01, pp. 264-270.

Visokay, et al. "Application of HfSiON as a gate dielectric material", Applied Physics Letter, American Institute of Physics, New York, US, vol. 80, No. 17, Apr. 29, 2002, pp. 3183-3185.

* cited by examiner

ATOMIC LAYER DEPOSITION PROCESSES FOR NON-VOLATILE MEMORY DEVICES

BACKGROUND OF THE INVENTION

1. Field of the Invention

Embodiments of the invention generally relate to electronic devices and methods for forming electronic devices, and more particularly, in one embodiment, to memory devices and methods for forming memory devices.

2. Description of the Related Art

Flash memory has been widely used as non-volatile memory for a wide range of electronic applications, such as mobile phones, personal digital assistants (PDAs), digital cameras, MP3 players, USB devices, and the like. As flash memory is typically used for portable recording devices to store large amounts of information, a reduction in power consumption and cell sizes, along with increased operational speed, are very desirable.

A flash memory device 100, as depicted in FIG. 1, includes a floating gate electrode 102 for storing electrical charge. The floating gate electrode 102 is located on a tunnel oxide layer 104 which overlies a channel region 106 located between source and drain regions 108. Electrons are transferred to the floating gate electrode 102 through the tunnel dielectric layer 104 overlying the channel region 106. Electron transfer is generally initiated by either hot electron injection or Fowler-Nordheim tunneling. An overlying control gate electrode 110, which is capacitively coupled to the floating gate electrode 102, applies a voltage potential to the floating gate electrode 102. The floating gate electrode 102 is separated from the control gate electrode 110 by an inter-poly dielectric 112 which generally contains an oxide-nitride-oxide structure ("ONO"). However, as device dimensions are reduced and the corresponding thickness of the ONO structure is reduced leakage currents through the thinner ONO structure have increased.

Therefore there is a need for a device and methods for forming a device that allow for a reduction in device dimensions while also maintaining or reducing leakage current with high charge carrier mobility for electronic devices, such as memory devices.

SUMMARY OF THE INVENTION

A memory device and methods for forming a memory device in an integrated process tool are provided in embodiments herein. In one embodiment, generally, a memory device is provided which includes a polysilicon control gate disposed over an inter-poly dielectric stack of four layers disposed over a polysilicon floating gate. The inter-poly dielectric stack contains upper and lower aluminum oxide layers separated by a hafnium silicon oxynitride layer, and a silicon oxynitride layer is disposed under the lower aluminum oxide layer.

In a specific embodiment, a non-volatile memory device is provided which includes a source region and a drain region disposed on a substrate, a floating gate polysilicon layer disposed over the source and drain regions, a silicon oxynitride layer disposed over the floating gate polysilicon layer, a first aluminum oxide layer disposed over the silicon oxynitride layer, a hafnium silicon oxynitride layer disposed over the first aluminum oxide layer, a second aluminum oxide layer disposed over the hafnium silicon oxynitride layer, and a control gate polysilicon layer disposed over the second aluminum oxide layer.

In another embodiment, a method for fabricating a non-volatile memory device is provided which includes depositing a floating gate polysilicon layer on a substrate, depositing a silicon oxynitride layer on the floating gate polysilicon layer, depositing a first aluminum oxide layer on the silicon oxynitride layer, depositing a hafnium silicon oxynitride layer on the first aluminum oxide layer, depositing a second aluminum oxide layer on the hafnium silicon oxynitride layer, and depositing a control gate polysilicon layer on the second aluminum oxide layer.

In another embodiment, the silicon oxynitride layer may be formed by depositing or growing a silicon oxide material on the floating gate polysilicon layer, implanting nitrogen into the silicon oxide material during a plasma nitridation process, and heating the substrate to a temperature of about 700° C. or higher during a post nitridation annealing (PNA) process. In one example, the temperature during the PNA process may be within a range from about 700° C. to about 1,000° C. The nitrogen may be implanted into the silicon oxide material such that the nitrogen concentration is within a range from about 5 atomic percent (at %) to about 50 at %. Examples provide that the silicon oxynitride layer may have a thickness within a range from about 0.5 nm and about 10 nm, preferably, from about 1 nm and about 3 nm. Some examples provide that the silicon oxide material may be formed by exposing the substrate to a deposition gas containing a silicon precursor and ozone.

In other embodiments, each of the first and second aluminum oxide layers may be independently deposited by an atomic layer deposition (ALD) process. Each of the first and second aluminum oxide layers independently may have a thickness within a range from about 0.5 nm and about 20 nm, preferably, from about 1 nm and about 10 nm.

In another embodiment, the hafnium silicon oxynitride layer may be formed by depositing a hafnium silicate material over the first aluminum oxide layer, implanting nitrogen into the hafnium silicate material a during a plasma nitridation process, and heating the substrate to a temperature of about 600° C. or higher during a PNA process. In one example, the temperature during the PNA process is within a range from about 600° C. to about 1,100° C. The nitrogen may be implanted into the hafnium silicate material such that the nitrogen concentration is within a range from about 10 at % to about 20 at %. The hafnium silicate material may have a thickness within a range from about 0.5 nm and about 20 nm, preferably, from about 1 nm and about 8 nm. In one example, the hafnium silicate material may be deposited by a metal-organic chemical vapor deposition (MO-CVD) process. The temperature of the substrate during the MO-CVD process may be within a range from about 600° C. to about 1,000° C.

In another embodiment, generally, a memory device is provided which includes a polysilicon control gate disposed over an inter-poly dielectric stack of four layers disposed over a polysilicon floating gate. The inter-poly dielectric stack contains upper and lower silicon oxynitride layers separated by a silicon nitride layer, and a silicon oxide layer disposed under the lower silicon oxynitride layer.

In a specific embodiment, a non-volatile memory device is provided which includes a source region and a drain region disposed on a substrate, a floating gate polysilicon layer disposed over the source and drain regions, a silicon oxide layer disposed over the floating gate polysilicon layer, a first silicon oxynitride layer disposed over the silicon oxide layer, a silicon nitride layer disposed over the first silicon oxynitride layer, a second silicon oxynitride layer disposed over the silicon nitride layer, and a control gate polysilicon layer disposed over second silicon oxynitride layer.

In another embodiment, a method for fabricating a non-volatile memory device is provided which includes depositing a floating gate polysilicon layer on a substrate, depositing a silicon oxide layer on the floating gate polysilicon layer, depositing a first silicon oxynitride layer on the silicon oxide layer, depositing a silicon nitride layer on the first silicon oxynitride layer, depositing a second silicon oxynitride layer on the silicon nitride layer, and depositing a control gate polysilicon layer on second silicon oxynitride layer.

In one example, the silicon oxide layer is formed by a re-oxidation process. The silicon oxide layer may have a thickness within a range from about 0.2 nm and about 10 nm, preferably, from about 0.5 nm and about 5 nm. In another example, the silicon nitride layer may be deposited by an atomic layer deposition (ALD) process. The silicon nitride layer may have a thickness within a range from about 0.5 nm and about 20 nm, preferably, from about 1 nm and about 8 nm.

In another embodiment, the first silicon oxynitride layer or the second silicon oxynitride layer may be formed by depositing a silicon oxide material on the substrate, exposing the substrate to a temperature of about 900° C. or higher during a post deposition annealing (PDA) process, implanting nitrogen into the silicon oxide material a during a plasma nitridation process, and heating the substrate to a temperature of about 900° C. or higher during a PNA process. In one example, the silicon oxide material may be deposited by a low pressure chemical vapor deposition (LP-CVD) process. The silicon oxide material may have a thickness within a range from about 0.5 nm and about 20 nm, preferably, from about 3 nm and about 8 nm. In another example, the nitrogen may be implanted into the silicon oxide material such that the nitrogen concentration is within a range from about 10 at % to about 20 at %. The temperature during the PNA process may be within a range from about 900° C. to about 1,000° C.

In other embodiments, a non-volatile memory device is provided which includes source and drain regions, a channel region between the source and drain regions, a floating gate, a control gate, a first dielectric layer deposited between the channel region and the floating gate, a first oxynitride layer deposited adjacent the floating gate, a second dielectric layer deposited on the first oxynitride layer wherein the second dielectric layer contains a high-k dielectric material, and a second oxynitride layer deposited between the second dielectric layer and the control gate. In certain embodiments, the first oxynitride layer and the second oxynitride layer contain silicon oxynitride. In certain embodiments, the high-k dielectric material contains hafnium silicon oxynitride.

In another embodiment, a method for fabricating a non-volatile memory device is provided which includes positioning a substrate within a processing system, such as within a processing chamber and forming a first polysilicon layer on the substrate. A first oxynitride layer and a second oxynitride layer are formed on the substrate with a high-k dielectric material formed therebetween, and a second polysilicon layer is formed on the substrate.

In certain embodiments a method of fabricating a non-volatile memory device is provided. The method includes positioning a substrate and depositing a first polysilicon layer on the substrate. A silicon oxide layer is deposited on the substrate. The silicon oxide layer is exposed to nitridation process to form a silicon oxynitride layer. A high-k material is deposited on the substrate. The high-k material is subjected to a post deposition annealing process. The high-k material is exposed to a nitridation process followed by a post nitridation annealing process. A second silicon oxide layer is deposited on the substrate. The substrate is exposed to a nitridation process to form a second silicon oxynitride layer. The substrate is exposed to a post nitridation annealing process. In certain embodiments, a second polysilicon layer is deposited on the second silicon oxynitride layer.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
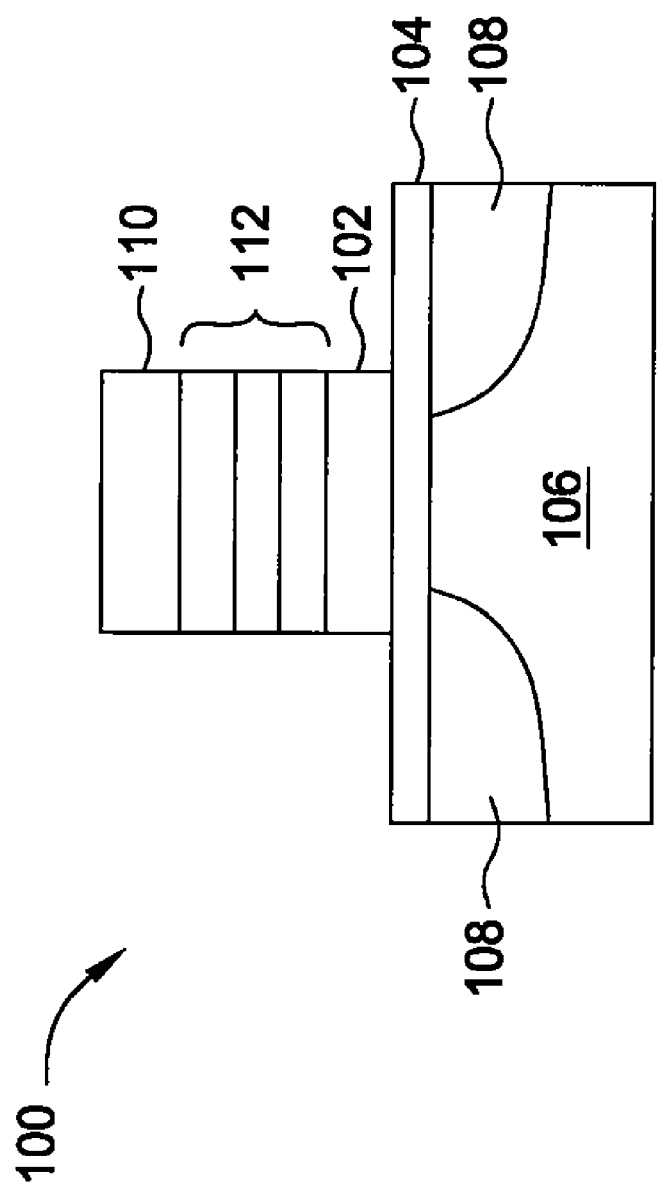
FIG. 1 depicts a two dimensional block diagram of a prior art flash memory cell.

To facilitate understanding, identical reference numerals have been used, where possible, to designate identical elements that are common to the figures. It is contemplated that elements and/or process steps of one or more embodiments may be beneficially incorporated in one or more other embodiments without additional recitation.

DETAILED DESCRIPTION

Embodiments of the invention as recited in the claims generally provide a structure and method for forming a structure used in a variety of applications, such as an inter-poly dielectric used in non-volatile memory devices. The improved inter-poly dielectric formed by the invention may include two silicon oxynitride layers with a high-k layer sandwiched in between.

Figure 2:
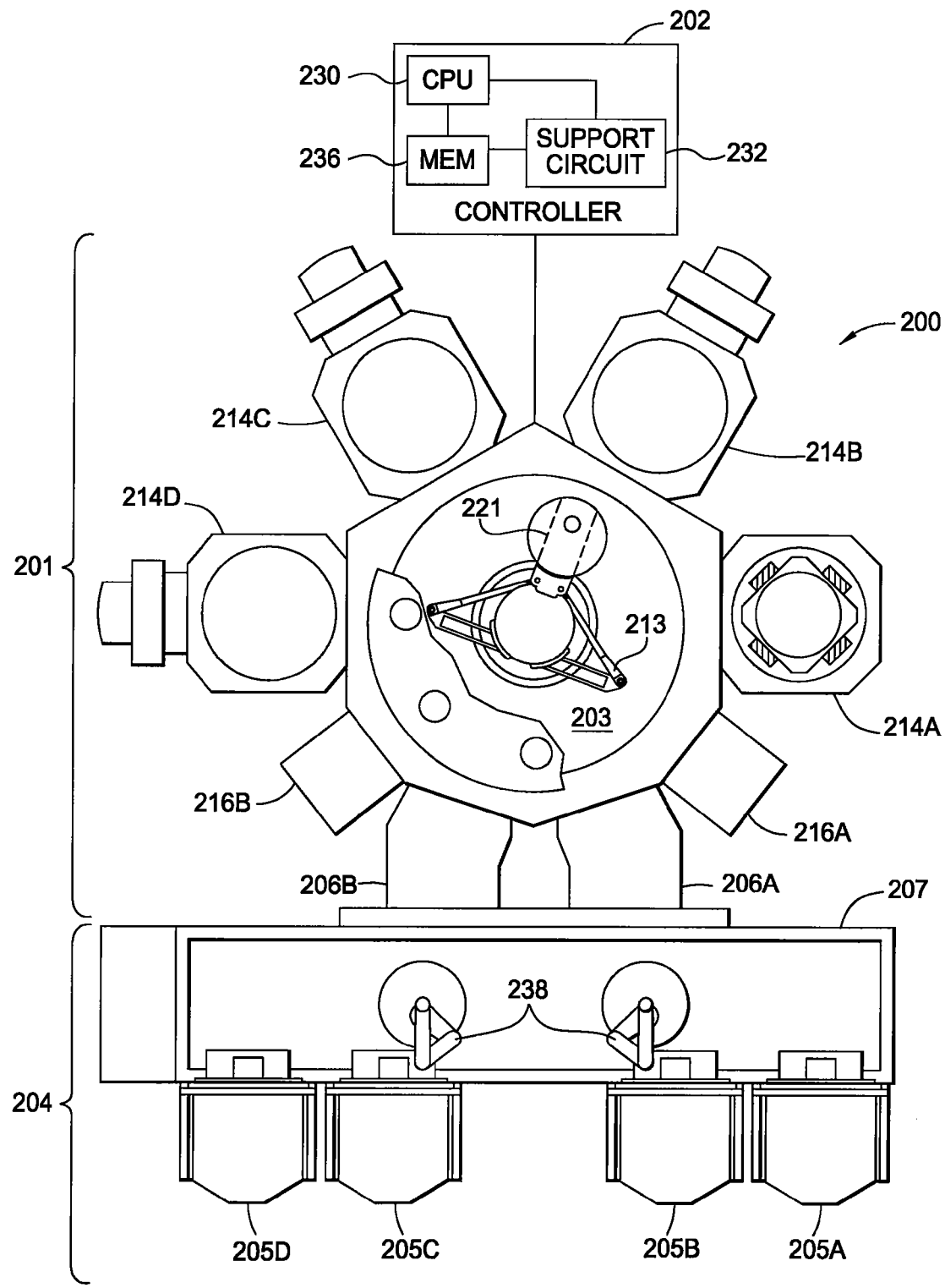
FIG. 2 depicts a schematic plan view of an exemplary integrated substrate processing system (e.g., a cluster tool) that may be used to practice embodiments described herein.

FIG. 2 depicts a schematic plan view of an exemplary integrated substrate processing system 200 of the kind used to practice certain embodiments of the invention. Examples of the processing system 200 include the PRODUCER®, CENTURA®, and ENDURA® integrated tools, all available from Applied Materials, Inc., of Santa Clara, Calif. It is contemplated that the methods described herein may be practiced in other tools having the requisite processing chambers coupled thereto, including those available from other manufacturers.

The processing system 200 includes a vacuum-tight processing platform 201, a factory interface 204, and a system controller 202. The platform 201 contains a plurality of processing chambers 214A-214D and load-lock chambers 206A-206B, which are coupled to a vacuum substrate transfer chamber 203. The factory interface 204 is coupled to the transfer chamber 203 by the load lock chambers 206A-206B. The processing system 200 includes a vacuum-tight processing platform 201, a factory interface 204, and a system controller 202. The platform 201 contains a plurality of processing chambers 214A-214D and load-lock chambers 206A-206B, which are coupled to a vacuum substrate transfer chamber 203. The factory interface 204 is coupled to the transfer chamber 203 by the load lock chambers 206A-206B.

In certain embodiments, the factory interface 204 contains at least one docking station 207, at least one factory interface robot 238 to facilitate transfer of substrates. The docking station 207 is configured to accept one or more front opening unified pod (FOUP). Four FOUPS 205A-205D are shown in the embodiment depicted in FIG. 2. The factory interface robot 238 is configured to transfer the substrate from the factory interface 204 to the processing platform 201 for processing through the loadlock chambers 206A-206B.

Each of the loadlock chambers 206A-206B have a first port coupled to the factory interface 204 and a second port coupled to the transfer chamber 203. The loadlock chamber 206A-206B are coupled to a pressure control system (not shown) which pumps down and vents the chambers 206A-206B to facilitate passing the substrate between the vacuum environment of the transfer chamber 203 and the substantially ambient (e.g., atmospheric) environment of the factory interface 204.

The transfer chamber 203 has a vacuum robot 213 disposed therein. The vacuum robot 213 is capable of transferring substrates 221 between the loadlock chamber 206A-206B and the processing chambers 214A-214D. In certain embodiments, the transfer chamber 203 may include a cool down station built therein to facilitate cooling down the substrate while transferring a substrate in the processing system 200.

In certain embodiments, the processing chambers coupled to the transfer chamber 203 may include chemical vapor deposition (CVD) chambers 214A-214B, decoupled plasma nitridation (DPN) chamber 214C, and rapid thermal process (RTP) chamber 214D. CVD chambers 214A-214B may include different types of CVD chambers, such as a thermal chemical vapor deposition (thermal-CVD) process, low pressure chemical vapor deposition (LP-CVD), metal-organic chemical vapor deposition (MO-CVD), plasma-enhanced chemical vapor deposition (PE-CVD), sub-atmosphere chemical vapor deposition (SACVD) and the like. Alternatively, different processing chambers, including at least one ALD, CVD, PVD, DPN, or RTP chamber, may be interchangeably incorporated into integrated processing system 200 in accordance with process requirements. Suitable ALD, CVD, PVD, DPN, RTP, and MO-CVD processing chambers are available from Applied Materials, Inc., among other manufacturers.

In certain embodiments, an optional service chamber (shown as 216A-216B) may be coupled to the transfer chamber 203. The service chambers 216A-216B may be configured to perform other substrate processes, such as degassing, orientation, pre-cleaning process, cool down, and the like.

The system controller 202 is coupled to integrated processing system 200. The system controller 202 controls the operation of the processing system 200 using a direct control of the processing chambers 214A-214D of the processing system 200 or alternatively, by controlling the computers (or controllers) associated with the processing chambers 214A-214D and processing system 200. In operation, the system controller 202 enables data collection and feedback from the respective chambers and system to optimize performance of the processing system 200.

Figure 3:
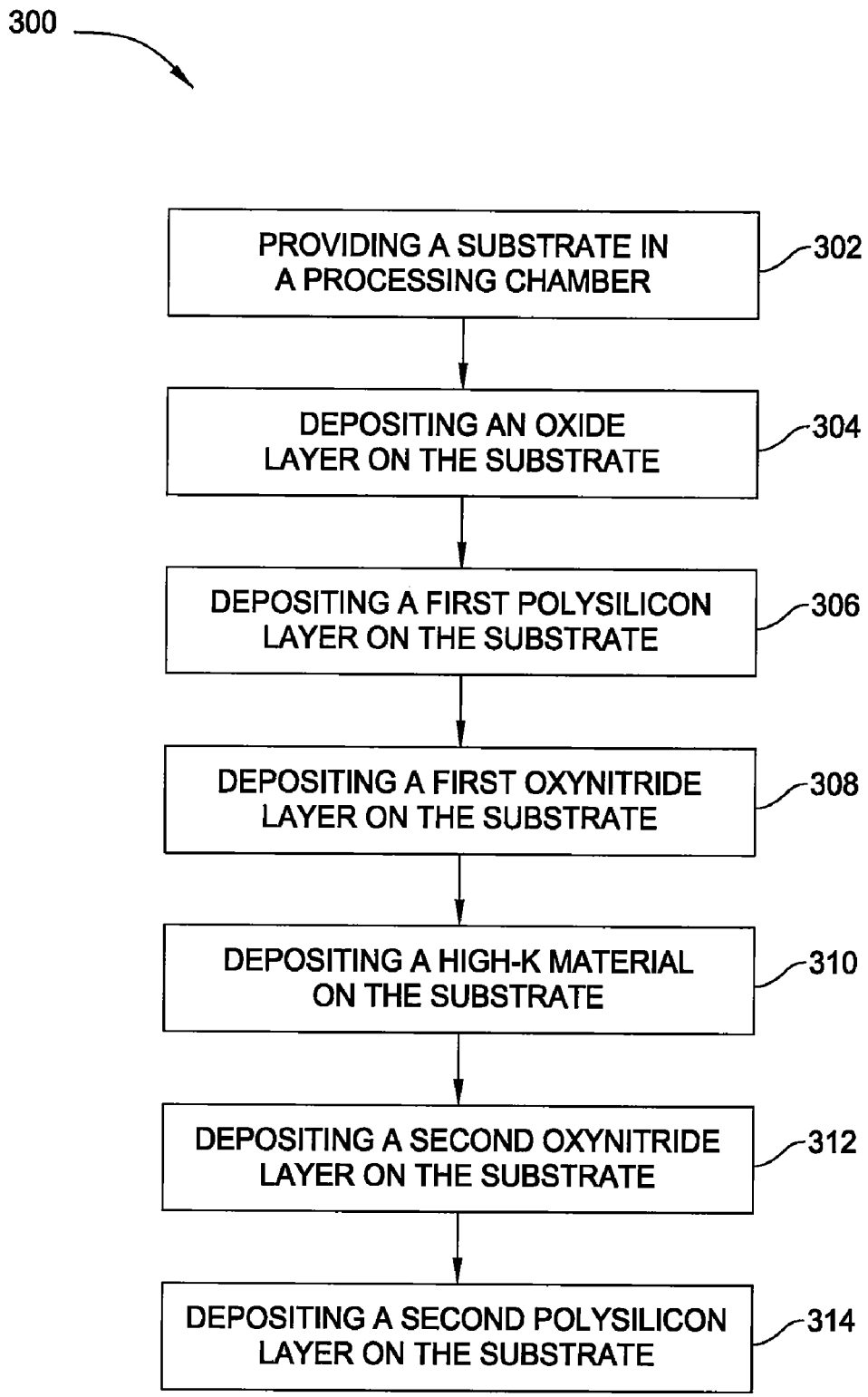
FIG. 3 depicts a process flow diagram of a deposition process according to an embodiment described herein.
Figure 4A:
FIGS. 4A-4G depict schematic cross-sectional views of a substrate in accordance with embodiments described herein.
Figure 4B:
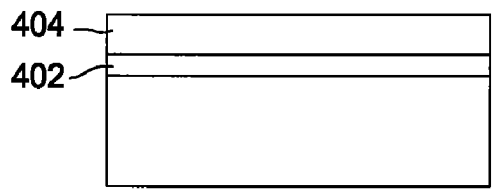
Figure 4C:
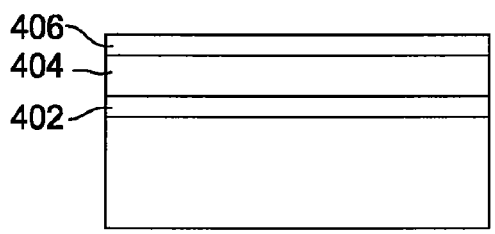
Figure 4D:
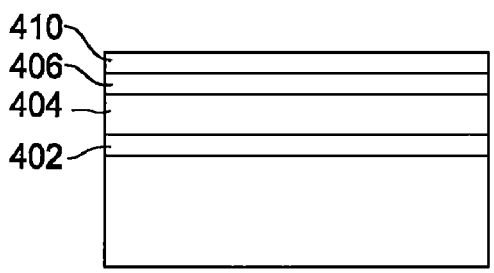
Figure 4E:
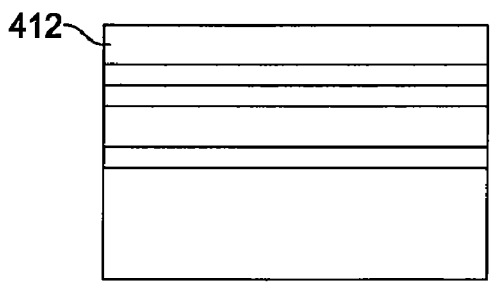
Figure 4F:
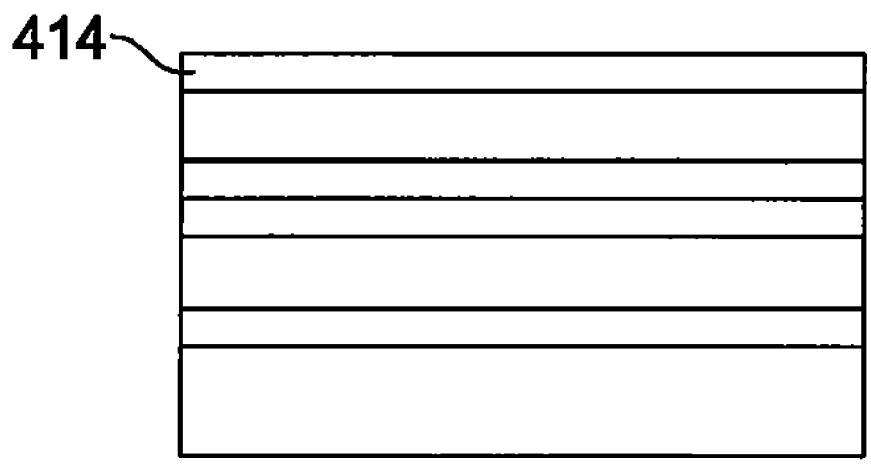
Figure 4G:
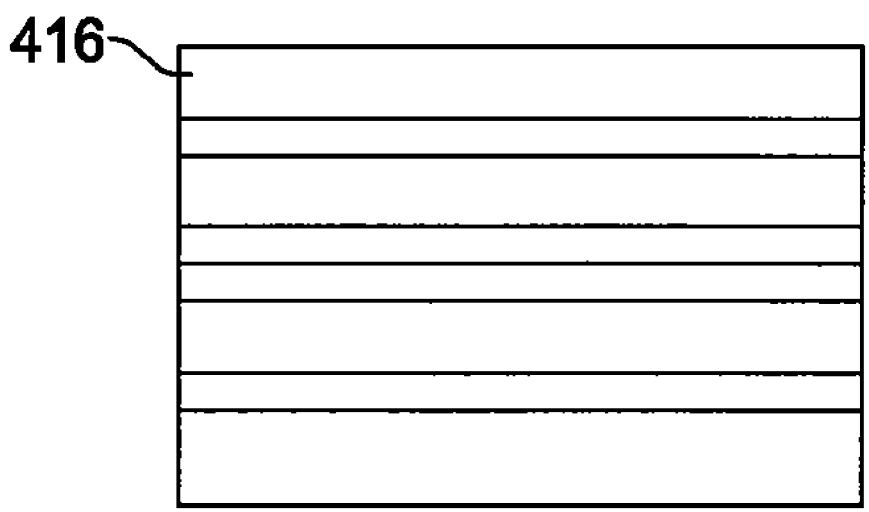

FIG. 3 depicts a process flow diagram of a deposition process 300 according to certain embodiments of the invention. It is also contemplated that the process 300 may be performed in other tools, including those from other manufacturers. FIGS. 4A-4G depict schematic cross-sectional views of a substrate structure in accordance with certain embodiments of the invention.

The process 300 begins at step 302 by providing a substrate 221 to a processing chamber, such as processing chamber 214A integrated into the system 200 described above. The substrate 221 refers to any substrate or material surface upon which film processing is performed. For example, the substrate 221 may be a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, sapphire, or other suitable workpieces. The substrate 221 may have various dimensions, such as 200 mm, 300 mm, or 450 mm diameter wafers, as well as, rectangular panels. Unless otherwise noted, embodiments and examples described herein are conducted on substrates with a 300 mm diameter. In certain embodiments, the substrate 221 may include an inter-poly dielectric film stack disposed thereon including a high-k material that may be suitable for non-volatile flash memory devices.

At step 304, an oxide layer is grown on the substrate 221. The dielectric film stack disposed on the substrate 221 includes a gate oxide layer 402 disposed on the substrate 221. The gate oxide layer 402 may be deposited by any suitable process. In certain embodiments, the gate oxide layer is grown using a RTP process. The gate oxide layer functions as a tunnel dielectric. In certain embodiments, the gate oxide layer 402 contains silicon dioxide. In certain embodiments, the gate oxide layer 402 contains a trace amount of nitrogen.

Prior to transferring the substrate 221 into the processing chamber 214A, a precleaning process may be performed to clean the substrate 221. The precleaning process is configured to cause compounds that are exposed on the surface of the substrate 221 to terminate in a functional group. Functional groups attached and/or formed on the surface of the substrate 221 include hydroxyls (OH), alkoxy (OR, where R=Me, Et, Pr, or Bu), haloxyls (OX, where X=F, Cl, Br or I), halides (F, Cl, Br, or I), oxygen radicals, and amidos (NR or $NR_2$, where R=H, Me, Et, Pr, or Bu). The precleaning process may expose the surface of the substrate 221 to a reagent, such as $NH_3$, $B_2H_6$, $SiH_4$, $Si_2H_6$, $H_2O$, HF, HCl, $O_2$, $O_3$, $H_2O_2$, $H_2$, atomic-H, atomic-N, atomic-O, alcohols, amines, plasmas thereof, derivatives thereof, or combinations thereof. The functional groups may provide a base for an incoming chemical precursor to attach on the surface of the substrate 221. In certain embodiments, the precleaning process may expose the surface of the substrate 221 to a reagent for a period from about 1 second to about 2 minutes. In certain embodiments, the exposure period may be from about 5 seconds to about 60 seconds. Precleaning processes may also include exposing the surface of the substrate 221 to an RCA solution (SC1/SC2), an HF-last solution, peroxide solutions, acidic solutions, basic solutions, plasmas thereof, derivatives thereof or combinations thereof. Useful precleaning processes are described in commonly assigned U.S. Pat. No. 6,858,547 and U.S. Ser. No. 10/302,752, filed Nov. 21, 2002, which published as US 2003/0232501, which are both incorporated herein by reference in their entirety.

In certain embodiments where a wet-clean process is performed to clean the substrate surface, the wet-clean process may be performed in a MARINER™ wet-clean system or a TEMPEST™ wet-clean system, available from Applied Materials, Inc. Alternatively, the substrate 221 may be exposed to water vapor derived from a WVG system for about 15 seconds.

At step 306, a first polysilicon layer 404 is deposited on the substrate 221. The first polysilicon layer 404 may be deposited using LP-CVD or other suitable processes for depositing a polysilicon layer. The first polysilicon layer 404 may function as a floating gate for storing electrical charge. The first polysilicon layer 404 is generally deposited having a film thickness within a range from about 50 nm to about 400 nm, preferably, from about 100 nm to about 300 nm, and more preferably, from about 150 nm to about 200 nm. The first polysilicon layer 404 may be deposited while the interior of the processing chamber is at a temperature of about 720° C. and a pressure of about 275 Torr.

Optionally, a second oxide layer 406 is deposited on the substrate 221 using rapid thermal oxidation techniques. In certain embodiments, the second oxide layer 406 contains a silicon oxide film grown using a reduced pressure RTP chamber such as the RTP chamber 216 of integrated processing system 200 (FIG. 2). The silicon oxide film is formed by a rapid thermal oxidation, which is an oxidation process where the chamber uses lamps to quickly heat and dry a substrate surface to form an oxidized layer in the presence of oxygen. The rapid thermal oxidation of a silicon substrate (or a wafer) is carried out using a dry process rapid thermal oxidation with the presence of $O_2$, $O_2+N_2$, $O_2+Ar$, $N_2O$, or $N_2O+N_2$ gas mixtures. The gas or gas mixtures may have a total flow rate within a range from about 1 slm to about 5 slm. Alternatively, the rapid thermal oxidation of a silicon substrate is carried out using a wet process such as in-situ steam generation (ISSG) with the presence of $O_2+H_2$, $O_2+H_2+N_2$, or $N_2O+H_2$ having, for example, a total flow rate within a range from about 1 slm to about 5 slm and a hydrogen concentration within a range from about 1% to about 13%. In certain embodiments, the rapid thermal oxidation process used to form the silicon oxide dielectric film is performed at a processing temperature within a range from about 750° C. to about 1,000° C. and a processing pressure within a range from about 0.5 Torr to about 50 Torr for a time period within a range from about 5 seconds to about 90 seconds. The deposited silicon oxide dielectric film may have a thickness within the range from about 0.4 nm to about 1.5 nm. The second oxide layer 406 may be deposited having a film thickness within a range from about 0.5 nm to about 10 nm, preferably, from about 5 nm to about 10 nm, and more preferably, from about 7 nm to about 10 nm.

At step 308, a first oxynitride layer 410 is deposited on substrate 221. The first oxynitride layer 410 is formed by depositing a silicon oxide layer followed by a plasma nitridation step. The silicon oxide layer may be deposited using RTP, conventional chemical vapor deposition (CVD), rapid thermal-CVD (RT-CVD), plasma-enhanced CVD (PE-CVD), physical vapor deposition (PVD), atomic layer deposition (ALD), plasma-enhanced atomic layer deposition (PE-ALD), atomic layer epitaxy (ALE), derivatives thereof, or combinations thereof. The first silicon oxynitride layer 410 is generally deposited having a film thickness within a range from about 0.5 nm to about 30 nm, preferably, from about 1 nm to about 20 nm, and more preferably, from about 3 nm to about 8 nm.

In certain embodiments, deposition of the silicon oxide layer using LP-CVD is achieved by exposing the substrate 221 to an oxygen precursor gas such as $N_2O$ at a bottom flow rate within a range from about 1,000 sccm to about 4,000 sccm, for example, about 3,000 sccm, nitrogen gas at a top flow rate within a range from about 1,000 sccm to about 2,000 sccm, for example, about 1,800 sccm, and a silicon precursor gas such as $SiH_4$ having a flow rate within a range from about 1 sccm to about 20 sccm, for example, about 4 sccm, at a temperature within a range from about 500° C. to about 1,000° C., for example, about 700° C., a pressure within a range from about 200 Torr to about 1,000 Torr, for example, about 275 Torr. The silicon precursor gas may contain a silicon precursor such as silane ($SiH_4$), disilane ($Si_2H_6$), tetrachlorosilane ($SiCl_4$), dichlorosilane ($Si_2Cl_2H_2$), trichlorosilane ($SiCl_3H$), and combinations thereof. The oxygen precursor gas may contain an oxygen precursor such as atomic oxygen (O), oxygen ($O_2$), ozone ($O_3$), nitrous oxide ($N_2O$), nitric oxide (NO), nitrogen dioxide ($NO_2$), dinitrogen pentoxide ($N_2O_5$), plasmas thereof, radicals thereof, derivatives thereof, or combinations thereof.

In certain embodiments, a silicon oxide material is deposited on the substrate. The silicon oxide material may be formed by exposing the substrate to at least one deposition gas during the deposition process. In certain embodiments, the deposition process is a CVD process having a deposition gas that may contain a silicon precursor and an oxygen precursor or a precursor containing both silicon and oxygen sources. Alternatively, the deposition process may be an ALD process having at least two deposition gases, such that, the substrate is sequentially exposed to a silicon precursor and an oxygen precursor.

Examples of suitable oxygen precursors for forming silicon oxide materials during step 308 include atomic oxygen (O), oxygen ($O_2$), ozone ($O_3$), water ($H_2O$), hydrogen peroxide ($H_2O_2$), organic peroxides, alcohols, nitrous oxide ($N_2O$), nitric oxide (NO), nitrogen dioxide ($NO_2$), dinitrogen pentoxide ($N_2O_5$), plasmas thereof, radicals thereof, derivatives thereof, or combinations thereof. In certain embodiments, an oxygen precursor may be formed by combining ozone and water to provide a strong oxidizing agent. The oxygen precursor generally contains hydroxyl radicals (OH) which have strong oxidizing power. The ozone concentration may vary relative to the water concentration. A molar ratio of ozone to water ratio may be within a range from about 0.01 to about 30, preferably, from about 0.03 to about 3, and more preferably, from about 0.1 to about 1.

Examples of suitable silicon precursors for forming silicon oxide materials during step 308 include silanes, alkylsilanes, halosilanes, alkoxysilanes, amidosilanes, amidodisilanes, silylazides, silylhydrazines, or derivatives thereof. Some specific examples of silicon precursors include silane ($SiH_4$), disilane ($Si_2H_6$), trisilane ($Si_3H_8$), methylsilane ($CH_3SiH_3$), bis(tertbutylamido)silane (BTBAS or ($^tBu(H)N)_2SiH_2$), tetraethoxysilane (($EtO)_4Si$ or TEOS), hexachlorodisilane (HCD or $Si_2Cl_6$), tetrachlorosilane ($SiCl_4$), dichlorosilane ($H_2SiCl_2$), 1,2-diethyltetrakis(diethylamido)disilane (($CH_2CH_3((CH_3CH_2)_2N)_2Si)_2$), 1,2-dichlorotetrakis(diethylamido)disilane (($Cl((CH_3CH_2)_2N)_2Si)_2$), hexakis(N-pyrrolidinio)disilane ((($C_4H_9N)_3)Si)_2$), 1,1,2,2-tetrachloro-bis(di(trimethyl silyl)amido)disilane, (($Cl_2((CH_3)_3Si)_2N)Si)_2$), 1,1,2,2-tetrachloro-bis(diisopropylamido)disilane, (($Cl_2((C_2H_7)_2N)Si)_2$), 1,2-dimethyltetrakis(diethylamido)disilane (($CH_3(CH_3CH_2N)_2Si)_2$), tris(dimethylamido)silane azide ((($CH_3)_2N)_3SiN_3$), tris(methylamido)silane azide ((($CH_3)(H)N)_3SiN_3$), 2,2-dimethylhydrazine-dimethylsilane (($CH_3)_2(H)Si)(H)NN(CH_3)_2$), trisilylamine (($SiH_3)_3N$ or TSA), and hexakis(ethylamido)disilane ((($EtHN)_3Si)_2$), radicals thereof, plasmas thereof, derivatives thereof, or combinations thereof.

In certain embodiments, an alkoxysilane compound is used as the silicon precursors for forming silicon oxide materials during step 308. The alkoxysilane may have the chemical formula $(RO)_nSiR'_{(4-n)}$, wherein n=1, 2, 3, or 4, each R, independently, may be methyl, ethyl, propyl, butyl, or other alkyl group, and each R', independently, may be hydrogen, a halogen group, methyl, ethyl, propyl, butyl, or other alkyl group. Examples of alkoxysilane compounds that may be used as silicon precursors include tetraethoxysilane ($(EtO)_4Si$ or TEOS), tetramethoxysilane ($(MeO)_4Si$), tetrapropoxysilane ($(PrO)_4Si$), tetraisopropoxysilane ($(^iPrO)_4Si$), tetrabutoxysilane ($(BuO)_4Si$), triethoxysilane ($(EtO)_3SiH$), diethoxysilane ($(EtO)_2SiH_2$), diethoxydimethylsilane ($(EtO)_2SiMe_2$), diethoxydiethylsilane ($(EtO)_2SiEt_2$), dimethoxydiethoxsilane ($(MeO)_2Si(OEt)_2$), derivatives thereof, or combinations thereof. In another embodiment, an alkoxysilane compound (e.g., TEOS) may be used as a source for both silicon and oxygen, instead of separate silicon and oxygen precursors, to form a silicon oxide material during step 308.

In certain embodiments, at step 308, the oxygen precursor and the silicon precursor may be introduced into processing chamber or exposed to substrate 221 simultaneously, such as during a traditional CVD process or sequentially, such as during an ALD process. The ALD process may expose the substrate to at least two deposition gases, such that, the substrate is sequentially exposed to a silicon precursor and an oxygen precursor.

A description of CVD and ALD processes and apparatuses that may be modified (e.g., incorporating a UV radiation source) and chemical precursors that may be useful for depositing silicon oxide materials are further disclosed in commonly assigned U.S. Pat. Nos. 6,869,838, 6,825,134, 6,905,939, and 6,924,191, and commonly assigned U.S. Ser. No. 09/964,075, filed Sep. 25, 2001, and published as US 2003-0059535, U.S. Ser. No. 10/624,763, filed Jul. 21, 2003, and published as US 2004-0018738, U.S. Ser. No. 10/794,707, filed Mar. 4, 2004, and published as US 2004-0175961, and U.S. Ser. No. 10/688,797, filed Oct. 17, 2003, and published as US 2004-0224089, which are all herein incorporated by reference in their entirety.

As the silicon precursor and the oxygen precursor may be combined in the processing chamber, a silicon-containing material, such as a silicon oxide material, is formed on the substrate surface. In certain embodiments, the silicon oxide material may be deposited at a rate within a range from about 10 Å/min to about 500 Å/min and is deposited to a thickness within a range from about 10 Å to about 1,000 Å. Silicon oxide materials may have the chemical formula of $SiO_x$, wherein x is about 2 or less, for example, about 1.8. In certain embodiments, the materials formed as described herein exhibits low hydrogen concentration and includes a small amount of carbon doping, which enhances boron retention in PMOS devices. In certain embodiments, a halogen-free silicon precursor improves the wet etch rate.

A carrier gas may be provided during step 308 to control the partial pressure of the oxygen precursor and the silicon precursor. The total internal pressure of a single wafer processing chamber may be at a pressure within a range from about 100 mTorr to about 740 Torr, preferably, from about 250 mTorr to about 400 Torr, and more preferably, from about 500 mTorr to about 200 Torr. In one example, the internal pressure of the processing chamber may have an internal pressure of about 150 Torr or less, preferably, about 100 Torr or less, and more preferably, about 50 Torr or less. In some embodiments, the carrier gas may be provided to control the partial pressure of the nitrogen precursor or the silicon precursor within a range from about 100 mTorr to about 1 Torr for batch processing systems. Examples of suitable carrier gases include nitrogen, hydrogen, argon, helium, forming gas, or combinations thereof.

In certain embodiments, after the silicon oxide film is formed in the LP-CVD chamber 214A, the substrate 221 is transferred to DPN chamber 214C of integrated processing system 200 under an inert (e.g., $N_2$ or Ar) environment with the transfer chamber pressure being approximately the same pressure for the plasma nitiridation process. The plasma nitridation process exposes the silicon oxide film to nitrogen plasma and incorporates nitrogen into the silicon oxide film to form a silicon oxynitride film. In one embodiment, DPN chamber 214C is a reduced pressure inductively coupled RF plasma reactor that can accommodate an inert gas such as $N_2$, He, or Ar. Process conditions are set to incorporate, for example, within a range from about 10% to about 20% of nitrogen into the silicon oxide film.

In certain embodiments the substrate 221 is transferred to annealing chamber 214D, such as the XE, XE Plus, or RADIANCE® RTP chamber available from Applied Materials, Inc., located in Santa Clara, Calif., for a post deposition annealing of the silicon oxynitride layer 410 in an oxygen containing atmosphere. A post nitridation anneal is performed where the substrate is annealed and heated to a temperature within a range from about 500° C. to about 1,200° C., preferably, from about 900° C. to about 1,100° C. for a time period within a range from about 1 second to about 240 seconds, preferably, from about 30 seconds to about 90 seconds, for example, about 1,000° C. for about 60 seconds. Generally, the annealing chamber atmosphere contains at least one anneal gas, such as $O_2$, $O_3$, $N_2$, $NH_3$, $N_2H_4$, NO, $N_2O$, or combinations thereof. The annealing chamber may have an internal pressure within a range from about 5 Torr to about 100 Torr, for example, about 50 Torr.

At step 310, a high-k dielectric layer 412 is deposited on the first oxynitride layer by a vapor deposition process, such as ALD, CVD, PVD, thermal techniques, or combinations thereof. In certain embodiments, the high-k dielectric layer may be deposited by ALD processes and apparatuses as described in commonly assigned U.S. Ser. Nos. 11/127,767 and 11/127,753, both filed May 12, 2005, and published as US 2005-0271813 and US 2005-0271812, which are incorporated herein by reference in their entirety for the purpose of describing methods and apparatuses used during ALD processes. High-k dielectric layer 412 is generally deposited having a film thickness within a range from about 0.5 nm to about 30 nm, preferably, from about 1 nm to about 20 nm, and more preferably, from about 1 nm to about 8 nm.

High-k dielectric layer 412 is deposited on the substrate surface and may have a variety of compositions that are homogenous, heterogeneous, graded and/or multiple layered stacks or laminates. High-k dielectric layer 412 is generally a high-k dielectric material and may include combinations of hafnium, zirconium, titanium, tantalum, lanthanum, aluminum, silicon, oxygen, and/or nitrogen. High-k dielectric layer 412 may have a composition that includes hafnium-containing materials, such as hafnium oxides ($HfO_x$ or $HfO_2$), hafnium silicates ($HfSi_xO_y$ or $HfSiO_4$), hafnium silicon oxynitrides ($HfSi_xO_yN_z$), hafnium oxynitrides ($HfO_xN_y$), hafnium aluminates ($HfAl_xO_y$), hafnium aluminum silicates ($HfAl_xSi_yO_z$), hafnium aluminum silicon oxynitrides ($HfAl_wSi_xO_yN_z$), hafnium lanthanum oxides ($HfLa_xO_y$), zirconium-containing materials, such as zirconium oxides ($ZrO_x$ or $ZrO_2$), zirconium silicates ($ZrSi_xO_y$ or $ZrSiO_4$), zirconium silicon oxynitrides ($ZrSi_xO_yN_z$), zirconium oxynitrides ($ZrO_xN_y$), zirconium aluminates ($ZrAl_xO_y$), zirconium aluminum silicates ($ZrAl_xSi_yO_z$), zirconium aluminum silicon oxynitrides ($ZrAl_wSi_xO_yN_z$), zirconium lanthanum oxides ($ZrLa_xO_y$), other aluminum-containing materials or lanthanum-containing materials, such as aluminum oxides ($Al_2O_3$ or $AlO_x$), aluminum oxynitrides ($AlO_xN_y$), aluminum silicates ($AlSi_xO_y$), aluminum silicon oxynitrides ($AlSi_xO_yN_z$), lanthanum aluminum oxides ($LaAl_xO_y$), lanthanum oxides ($LaO_x$ or $La_2O_3$), derivatives thereof, or combinations thereof. Other dielectric materials useful for high-k dielectric layer 412 may include titanium oxides ($TiO_x$ or $TiO_2$), titanium oxynitrides ($TiO_xN_y$), tantalum oxides ($TaO_x$ or $Ta_2O_5$) and tantalum oxynitrides ($TaO_xN_{x\backslash y}$). Laminate films that are useful dielectric materials for high-k dielectric layer 412 include $HfO_2/Al_2O_3$, $HfO_2/SiO_2$, $La_2O_3/Al_2O_3$, and $HfO_2/SiO_2/Al_2O_3$.

In certain embodiments, the ALD process is conducted in a processing chamber, for example, processing chamber 214B, having an internal pressure within a range from about 1 Torr to about 100 Torr, preferably, from about 1 Torr to about 20 Torr, and more preferably, from about 3 Torr to about 4 Torr. The temperature of the substrate is usually heated to a temperature within a range from about 70° C. to about 1,000° C., preferably, from about 100° C. to about 750° C., and more preferably, from about 550° C. to about 700° C. In certain embodiments, a hafnium precursor is introduced into the processing chamber at a rate within a range from about 5 mg/min to about 20 mg/min. The hafnium precursor is usually introduced with a carrier gas, such as nitrogen, having a total flow rate within a range from about 50 sccm to about 1,000 sccm. The hafnium precursor may be pulsed into the processing chamber at a rate within a range from about 0.1 seconds to about 10 seconds, depending on the particular process conditions, hafnium precursor or desired composition of the deposited hafnium-containing material. In certain embodiments, the hafnium precursor is pulsed into the processing chamber at a rate within a range from about 1 second to about 5 seconds, for example, about 3 seconds.

In certain embodiments, the hafnium precursor is pulsed into the processing chamber at a rate within a range from about 0.1 seconds to about 1 second, for example, about 0.5 seconds. In one example, the hafnium precursor is preferably TDEAH, the silicon precursor (Tris-DMAS), and in-situ water vapor produced by a water vapor generator (WVG) system, available from Fujikin of America, Inc., located in Santa Clara, Calif. The ALD cycle includes co-flowing TDEAH and Tris-DMAS in a first half reaction and sequentially pulsing water vapor in a second half reaction, with each half reaction separated by an argon purge. The hafnium silicate layer is formed by repeating the cycle ten times until the film has a thickness of about 4 Å.

The pulses of a purge gas, preferably argon or nitrogen, are typically introduced having a flow rate in a range from about 2 standard liters per minute (slm) to about 22 slm, preferably about 10 slm. Each processing cycle occurs for a time period within a range from about 0.01 seconds to about 20 seconds. In one example, the process cycle lasts about 10 seconds. In another example, the process cycle lasts about 2 seconds. Longer processing steps lasting about 10 seconds deposit excellent hafnium-containing films, but reduce the throughput. The specific purge gas flow rates and duration of process cycles are obtained through experimentation. In one example, a 300 mm diameter wafer requires about twice the flow rate for the same duration as a 200 mm diameter wafer in order to maintain similar throughput. An oxidizing gas is introduced into the processing chamber having a flow rate within a range from about 0.05 sccm to about 1,000 sccm, preferably, from about 0.5 sccm to about 100 sccm. The oxidizing gas is pulsed into the processing chamber at a rate within a range from about 0.05 seconds to about 10 seconds, preferably, from about 0.08 seconds to about 3 seconds, and more preferably, from about 0.1 seconds to about 2 seconds. In one embodiment, the oxidizing gas is pulsed at a rate within a range from about 1 second to about 5 seconds, for example, about 1.7 seconds. In another embodiment, the oxidizing gas is pulsed at a rate within a range from about 0.1 seconds to about 3 seconds, for example, about 0.5 seconds.

In certain embodiments, substrate 221 may be optionally exposed to a post deposition annealing (PDA) process. Substrate 221 containing high-k dielectric layer 412 is transferred to annealing chamber 214D, such as the CENTURA® RADIANCE® RTP chamber available from Applied Materials, Inc., located in Santa Clara, Calif. and exposed to the PDA process. Substrate 221 may be heated to a temperature within a range from about 600° C. to about 1,200° C., preferably from about 600° C. to about 1,150° C., and more preferably from about 600° C. to about 1,000° C. The PDA process may last for a time period within a range from about 1 second to about 5 minutes, preferably, from about 1 minute to about 4 minutes, and more preferably from about 2 minutes to about 3 minutes. Generally, the chamber atmosphere contains at least one annealing gas, such as oxygen ($O_2$), ozone ($O_3$), atomic oxygen (O), water ($H_2O$), nitric oxide (NO), nitrous oxide ($N_2O$), nitrogen dioxide ($NO_2$), dinitrogen pentoxide ($N_2O_5$), nitrogen ($N_2$), ammonia ($NH_3$), hydrazine ($N_2H_4$), derivatives thereof, or combinations thereof. Often the annealing gas contains nitrogen and at least one oxygen precursor gas, such as oxygen. The chamber may have a pressure within a range from about 5 Torr to about 100 Torr, for example, about 10 Torr. In one example of a PDA process, the substrate containing an oxide layer is heated to a temperature of about 600° C. for about 4 minutes within an oxygen atmosphere.

In some embodiments, substrate 221 may be transferred into decoupled plasma nitridation (DPN) chamber 214C, such as the CENTURA DPN chamber, available from Applied Materials, Inc., located in Santa Clara, Calif., where a DPN process is performed therein. The plasma nitridation process exposes the high-k material 412 to nitrogen plasma and incorporates nitrogen into the high-k material 412 to form a nitrided high-k material. In certain embodiments, DPN chamber 214C is a reduced pressure inductively coupled RF plasma reactor that can accommodate an inert gas such as $N_2$, He, or Ar. Therefore, substrate 221 may be exposed to an inert plasma process without being exposed to the ambient environment. During the inert plasma process, the oxide layer 402 is bombarded with ionic argon formed by flowing argon into the DPN chamber. Gases that may be used in an inert plasma process include argon, helium, neon, xenon, or combinations thereof.

The inert plasma process proceeds for a time period from about 10 seconds to about 5 minutes, preferably from about 30 seconds to about 4 minutes, and more preferably, from about 1 minute to about 3 minutes. Also, the inert plasma process is conducted at a plasma power setting within a range from about 500 watts to about 3,000 watts, preferably, from about 700 watts to about 2,500 watts, and more preferably from about 900 watts to about 1,800 watts. Generally, the plasma process is conducted with a duty cycle of about 20% to about 100% and a pulse frequency at about 10 kHz. The DPN chamber may have a pressure within a range from about 10 mTorr to about 80 mTorr. The inert gas may have a flow rate within a range from about 10 standard cubic centimeters per minute (sccm) to about 5 standard liters per minute (slm), preferably from about 50 sccm to about 750 sccm, and more preferably from about 100 sccm to about 500 sccm.

In certain embodiments, the substrate 221 is exposed to a thermal annealing process. In certain embodiments, the substrate 221 is transferred to annealing chamber 214D, such as the CENTURA® RADIANCE® RTP chamber available from Applied Materials, Inc., located in Santa Clara, Calif., and exposed to the thermal annealing process. Substrate 221 may be heated to a temperature within a range from about 600° C. to about 1,200° C., preferably from about 700° C. to about 1,150° C., and more preferably from about 800° C. to about 1,000° C. The thermal annealing process may last for a time period within a range from about 1 second to about 120 seconds, preferably, from about 2 seconds to about 60 seconds, and more preferably from about 5 seconds to about 30 seconds. Generally, the chamber atmosphere contains at least one annealing gas, such as oxygen, ozone, atomic oxygen, water, nitric oxide, nitrous oxide, nitrogen dioxide, dinitrogen pentoxide, nitrogen, ammonia, hydrazine, derivatives thereof, or combinations thereof. Often the annealing gas contains nitrogen and at least one oxygen precursor gas, such as oxygen. The chamber may have an internal chamber pressure within a range from about 5 Torr to about 100 Torr, for example, about 10 Torr. In one example of a thermal annealing process, substrate 200 is heated to a temperature of about 1,050° C. for about 15 seconds within a nitrogen containing atmosphere with an extremely low amount of oxygen. In another example, substrate 200 is heated to a temperature of about 1,100° C. for about 25 seconds within an atmosphere containing equivalent volumetric amounts of nitrogen and oxygen. In another embodiment, substrate 200 is heated to a temperature of about 1,030° C. for about 30 seconds in a nitrogen atmosphere with a trace amount of oxygen.

The thermal annealing process repairs any damage caused by plasma bombardment during the DPN process and reduces the fixed charge of post anneal layer. The high-k material 412 may have a nitrogen concentration within a range from about 5 at % to about 25 at %, preferably, from about 10 at % to about 20 at %, for example, about 15 at %. The high-k material 412 may have a film thickness within a range from about 0.5 nm to about 30 nm, preferably, from about 1 nm to about 10 nm, and more preferably, from about 1 nm to about 8 nm.

At step 312, a second oxynitride layer 414 is deposited on the high-k dielectric layer. The second oxynitride layer 414 may be deposited using the same process conditions used to deposit the first oxynitride layer 410. The second oxynitride layer 414 is generally deposited having a film thickness within a range from about 0.5 nm to about 30 nm, preferably, from about 1 nm to about 20 nm, and more preferably, from about 3 nm to about 8 nm.

At step 314, a control gate polysilicon layer 416 is deposited on the second oxynitride layer 414. The polysilicon layer 416 can be formed in a deposition chamber such as LP-CVD deposition chamber 214A or ALD chamber 214B of integrated processing system 200 (FIG. 2). Instead of polysilicon, the film 416 can be an amorphous silicon film or other suitable conductive material. Further, metals such as titanium, titanium nitride, tantalum, tantalum nitride, tungsten, tungsten nitride, and other refractory metals or other suitable electrode materials may be deposited thereover. After the formation of the polysilicon film 416, the gate stack may be transferred to a cool down chamber and then transferred to a storage area such as load locks 206A and 206B for further processing, testing, or other processes known in the art.

It is to be appreciated that the gate stack that includes the gate dielectric film and the polysilicon cap film can be formed in several processing chambers not necessarily incorporated into integrated processing system 200 previously described.

Figure 5:
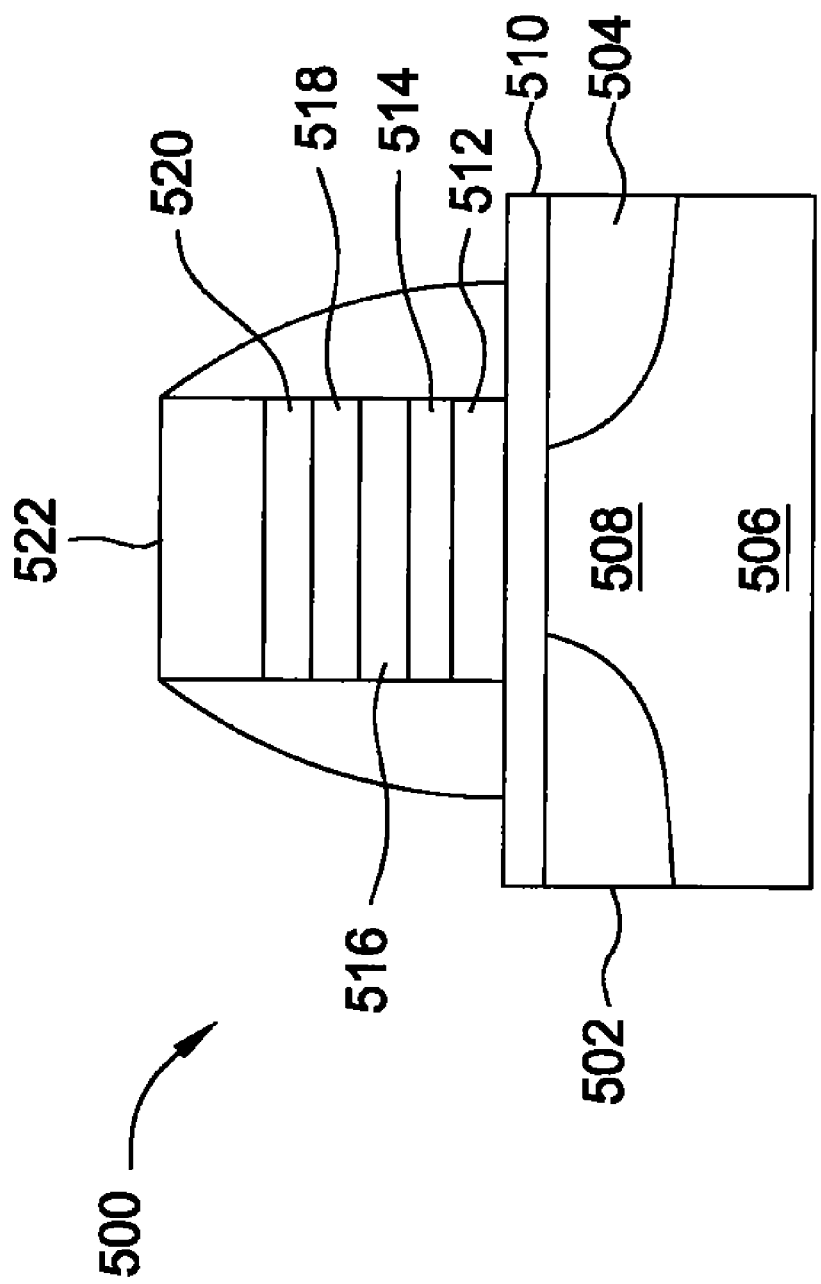
FIG. 5 depicts a two dimensional block diagram of one embodiment of a flash memory cell.

FIG. 5 depicts a two dimensional block diagram of one embodiment of a flash memory cell 500 according to the invention. The flash memory cell 500 includes source/drain regions 502 and 504 located in a semiconductor substrate 506 and separated by a channel region 508. A first oxide layer 510, for example, a silicon dioxide layer, or tunnel dielectric overlies the channel region 508. A floating gate 512 or first polysilicon layer overlies the tunnel dielectric 510. In certain embodiments, a second oxide layer 514 is located on the floating gate 514. A control gate 522 or second polysilicon layer overlies the floating gate 512 and is separated therefrom by an inter-poly dielectric containing a first oxynitride layer 516 and a second oxynitride layer 520 formed on the semiconductor substrate 506 with a high-k dielectric layer 518 formed therebetween.

Thus, a structure and methods for forming a structure that allow for a reduction in device dimensions while also maintaining or reducing leakage current for non-volatile memory devices has been provided. The improved structure and method for forming a structure include an inter-poly dielectric containing two silicon oxynitride layers with a high-k layer sandwiched therebetween.

Figure 6:
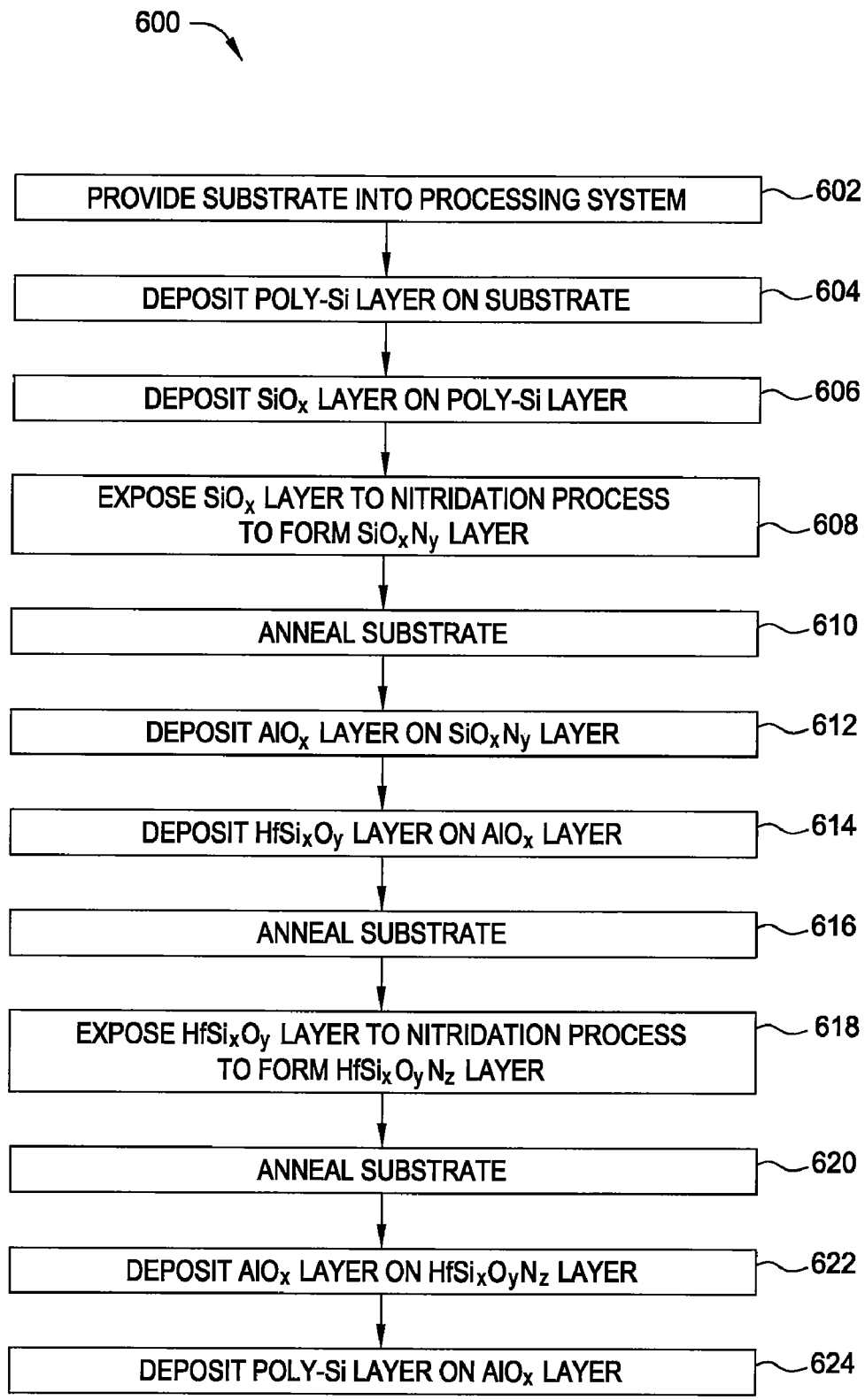
FIG. 6 depicts a process flow diagram of another deposition process according to an embodiment described herein.

In another embodiment, FIG. 6 depicts a process flow diagram of process 600. In one example, process 600 may be performed on processing system 200, as illustrated in FIG. 2. It is also contemplated that process 600 may be performed in other processing chambers and systems. FIGS. 7A-7F depict schematic cross-sectional views of substrate 700 during various processing steps of process 600, in accordance with embodiments of the invention.

During step 602 of process 600, substrate 700 having substrate surface 702 may be positioned within a processing chamber which is part of a processing system. Floating gate polysilicon layer 704 may be deposited on or over substrate surface 702 during step 604 and depicted in FIG. 7A. Subsequently, silicon oxynitride layer 706 may be formed on substrate 600 during steps 606, 608, and 610, as depicted in FIG. 7B. For example, a silicon oxide layer is deposited on or over floating gate polysilicon layer 704 at step 606, exposed a nitridation process to form silicon oxynitride layer 706 at step 608, and heated during an annealing process at step 610.

Figure 7A:
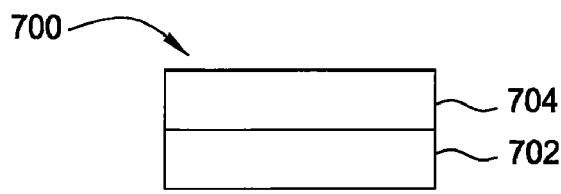
FIGS. 7A-7F depict schematic cross-sectional views of a substrate in accordance with embodiments described herein.
Figure 7B:
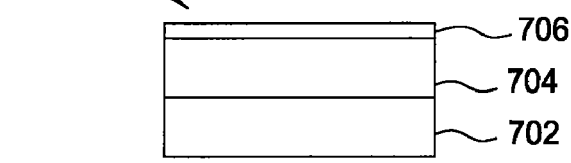
Figure 7C:
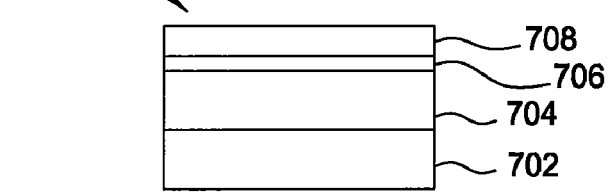
Figure 7D:
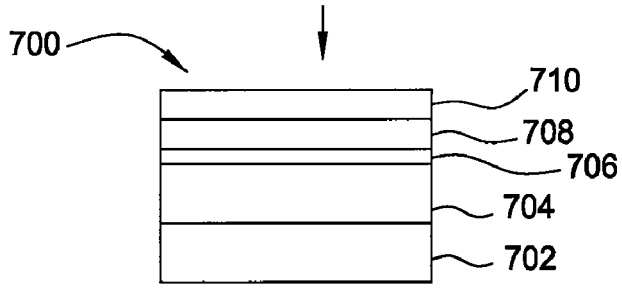

During step 612 and depicted in FIG. 7C, aluminum oxide layer 708 may be deposited on or over silicon oxynitride layer 706. Thereafter, hafnium silicon oxynitride layer 710 may be formed during steps 614-620, as depicted in FIG. 7D. For example, a hafnium silicate layer may be deposited on or over aluminum oxide layer 708 at step 614 and substrate 600 may be exposed to a PDA process at step 616. Subsequently, at step 618, the hafnium silicate layer may be exposed to a nitridation process to form hafnium silicon oxynitride layer 710 and then exposed to a PNA process at step 620.

Figure 7E:
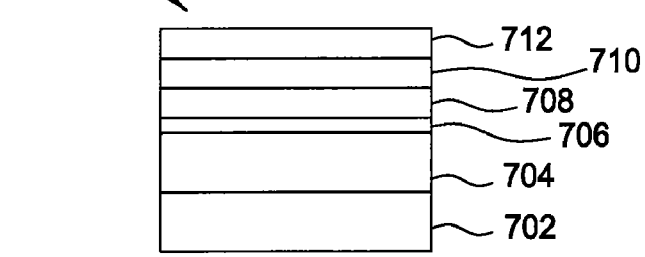
Figure 7F:
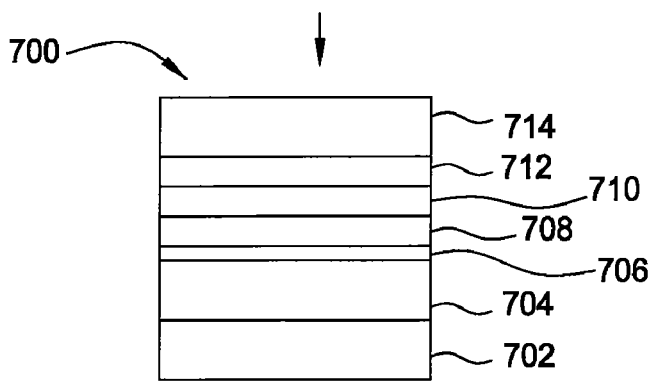

FIG. 7E illustrates aluminum oxide layer 712 that may be deposited on or over hafnium silicon oxynitride layer 710 at step 622. Thereafter, during step 624, control polysilicon layer 714 may be deposited on or over aluminum oxide layer 712, as depicted in FIG. 7F.

Process 600 begins at step 602 by positioning substrate 700 having substrate surface 702 into a processing chamber, such as processing chamber 214A integrated into the system 200 described above. Substrate 700 refers to any substrate or material surface upon which film processing is performed. For example, substrate 700 and/or substrate surface 702 may be a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, sapphire, or other suitable workpieces. Substrate 700 may have various dimensions, such as 200 mm, 600 mm diameter, or 450 mm wafers, as well as, rectangular or square panels. Unless otherwise noted, embodiments and examples described herein are conducted on substrates with a 200 mm diameter, a 300 mm diameter, or a 450 mm diameter. In certain embodiments, substrate 700 may include an inter-poly dielectric film stack disposed thereon including a high-k material that may be suitable for non-volatile flash memory devices.

Prior to transferring substrate 700 into the processing chamber, a precleaning process may be performed to clean substrate surface 702. The precleaning process exposes substrate surface 702 to reagents to produce a surface containing the desirable functional group. Functional groups attached and/or formed on the surface of substrate 700 include hydroxyls (OH), alkoxy (OR, where R=Me, Et, Pr, or Bu), haloxyls (OX, where X=F, Cl, Br, or I), halides (F, Cl, Br, or I), oxygen radicals and amidos (NR or $NR_2$, where R=H, Me, Et, Pr, or Bu). The precleaning process may expose substrate 700 to a reagent, such as $NH_3$, $B_2H_6$, $SiH_4$, $Si_2H_6$, $H_2O$, HF, HCl, $O_2$, $O_3$, $H_2O_2$, $H_2$, atomic-H, atomic-N, atomic-O, alcohols, amines, plasmas thereof, derivatives thereof, or combinations thereof. The functional groups may provide a base for an incoming chemical precursor to attach on substrate surface 702. In certain embodiments, the precleaning process may expose substrate surface 702 to a reagent for a period from about 1 second to about 2 minutes. In certain embodiments, the exposure period may be from about 5 seconds to about 60 seconds. Precleaning processes may also include exposing the surface of substrate 700 to an RCA solution (SC1/SC2), an HF-last solution, peroxide solutions, acidic solutions, basic solutions, plasmas thereof, derivatives thereof or combinations thereof. Useful precleaning processes are described in commonly assigned U.S. Pat. No. 6,858,547 and U.S. Ser. No. 10/302,752, filed Nov. 21, 2002, which published as US 2003/0232501, which are both incorporated herein by reference in their entirety.

In certain embodiments where a wet-clean process is performed to clean the substrate surface, the wet-clean process may be performed in a MARINER™ wet-clean system or a TEMPEST™ wet-clean system, available from Applied Materials, Inc. Alternatively, substrate 700 may be exposed to water vapor derived from a WVG system for about 15 seconds.

At step 604, polysilicon layer 704, such as a floating gate polysilicon layer, is deposited on substrate 700. Polysilicon layer 704 may be deposited using a LP-CVD process or other suitable processes for depositing a polysilicon layer. Polysilicon layer 704 may function as a floating gate for storing electrical charge. Polysilicon layer 704 is generally deposited having a film thickness within a range from about 50 nm to about 400 nm, preferably, from about 100 nm to about 600 nm, and more preferably, from about 150 nm to about 200 nm. Polysilicon layer 704 may be deposited during the LP-CVD process while the interior of the processing chamber is at a temperature of about 720° C. and a pressure of about 275 Torr.

During steps 606, 608, and 610, silicon oxynitride layer 706 may be formed on substrate 700 and is disposed on or over polysilicon layer 704. Silicon oxynitride layer 706 may be formed by depositing a silicon oxide layer (step 606), followed by exposing the silicon oxide layer to a plasma nitridation process (step 608), and subsequently, an annealing process (step 610). In step 606, the silicon oxide layer may be deposited using RTP, conventional CVD, RT-CVD, PE-CVD, PVD, ALD, PE-ALD, ALE, derivatives thereof, or combinations thereof. The silicon oxide layer is generally formed or deposited having a film thickness within a range from about 0.5 nm to about 30 nm, preferably, from about 1 nm to about 20 nm, and more preferably, from about 3 nm to about 8 nm.

In certain embodiments, deposition of the silicon oxide layer using LP-CVD is achieved by exposing substrate 700 to an oxygen precursor gas (e.g., $O_3$ or $N_2O$) having a flow rate within a range from about 1,000 sccm to about 4,000 sccm, for example, about 3,000 sccm, nitrogen gas having a flow rate within a range from about 1,000 sccm to about 2,000 sccm, for example, about 1,800 sccm, and a silicon precursor gas (e.g., $SiH_4$) having a flow rate within a range from about 1 sccm to about 20 sccm, for example, about 4 sccm, at a temperature within a range from about 500° C. to about 1,000° C., for example, about 700° C., a pressure within a range from about 100 Torr to about 1,000 Torr, for example, about 275 Torr.

In certain embodiments at step 606, a silicon oxide material is deposited on the substrate, such as on or over the underlying polysilicon layer. The silicon oxide material may be formed by exposing the substrate to at least one deposition gas during the deposition process. In certain embodiments, the deposition process is a CVD process having a deposition gas that may contain a silicon precursor and an oxygen precursor or a precursor containing both silicon and oxygen sources. Alternatively, the deposition process may be an ALD process, such that, the substrate is sequentially exposed to a silicon precursor and an oxygen precursor. In one example, a silicon oxide layer is deposited by a LP-CVD process utilizing silane as a silicon precursor and ozone as an oxygen precursor. In one embodiment, an alkoxysilane compound (e.g., TEOS) may be used as a source for both silicon and oxygen, instead of separate silicon and oxygen precursors, to form a silicon oxide material during step 606.

A description of CVD and ALD processes and apparatuses that may be modified (e.g., incorporating a UV radiation source) and chemical precursors that may be useful for depositing silicon oxide materials are further disclosed in commonly assigned U.S. Pat. Nos. 6,869,838, 6,825,134, 6,905, 939, and 6,924,191, and commonly assigned U.S. Ser. No. 09/964,075, filed Sep. 25, 2001, and published as US 2003-0059535, U.S. Ser. No. 10/624,763, filed Jul. 21, 2003, and published as US 2004-0018738, U.S. Ser. No. 10/794,707, filed Mar. 4, 2004, and published as US 2004-0175961, and U.S. Ser. No. 10/688,797, filed Oct. 17, 2003, and published as US 2004-0224089, which are all herein incorporated by reference in their entirety.

As the silicon precursor and the oxygen precursor may be combined within the processing chamber, the silicon oxide layer may be formed on the substrate surface, such as on the polysilicon layer. In certain embodiments, the silicon oxide layer may be deposited at a rate within a range from about 10 Å/min to about 500 Å/min. The deposited silicon oxide material may have the chemical formula of $SiO_x$, wherein x is about 2 or less, for example, about 1.8.

A carrier gas may be provided during step 606 to control the partial pressure of the oxygen precursor and the silicon precursor. The total internal pressure of a single wafer processing chamber may be at a pressure within a range from about 100 mTorr to about 740 Torr, preferably, from about 250 mTorr to about 400 Torr, and more preferably, from about 500 mTorr to about 200 Torr. In one example, the processing chamber may have an internal pressure of about 150 Torr or less, preferably, about 100 Torr or less, and more preferably, about 50 Torr or less. In some embodiments, the carrier gas may be provided to control the partial pressure of the nitrogen precursor or the silicon precursor within a range from about 100 mTorr to about 1 Torr for batch processing systems.

Examples of suitable carrier gases include nitrogen, hydrogen, argon, helium, forming gas, or combinations thereof.

In another embodiment, subsequent the deposition of the silicon oxide layer within the LP-CVD chamber 214A, substrate 700 may be transferred into DPN chamber 214C of integrated processing system 200 under an inert (e.g., $N_2$ or Ar) environment with the transfer chamber pressure being approximately the same pressure for the plasma nitridation process. The plasma nitridation process at step 608 exposes the silicon oxide layer to nitrogen plasma and incorporates nitrogen into the silicon oxide material to form the silicon oxynitride material of silicon oxynitride layer 706. In one embodiment, DPN chamber 214C is a reduced pressure inductively coupled RF plasma reactor that can accommodate an inert gas such as $N_2$, He, or Ar. Process conditions are set to incorporate, for example, within a range from about 10% to about 50% of nitrogen into the silicon oxide material, forming silicon oxynitride layer 706.

In certain embodiments substrate 700 is transferred to annealing chamber 214D, such as the XE, XE Plus, or RADI-ANCE® RTP chamber available from Applied Materials, Inc., located in Santa Clara, Calif., for a post deposition annealing of silicon oxynitride layer 706 in an oxygen containing atmosphere. During step 610, substrate 600 is exposed to a RTP or post nitridation annealing (PNA) process. Substrate 600 may be heated to a temperature within a range from about 500° C. to about 1,200° C., preferably, from about 600° C. to about 1,100° C., and more preferably, from about 700° C. to about 1,000° C. for a time period within a range from about 1 second to about 240 seconds, preferably, from about 30 seconds to about 90 seconds. Generally, the annealing chamber atmosphere contains at least one anneal gas, such as $O_2$, $O_3$, $N_2$, $NH_3$, $N_2H_4$, NO, $N_2O$, or combinations thereof. The annealing chamber may have an internal pressure within a range from about 5 Torr to about 100 Torr, for example, about 50 Torr.

During step 612, aluminum oxide layer 708 is deposited or formed on or over silicon oxynitride layer 706 by a vapor deposition process, such as ALD, CVD, or PVD. In one example, aluminum oxide layer 708 is deposited by sequentially exposing substrate 700 to an aluminum precursor and an oxygen precursor during an ALD process. Aluminum oxide layer 708 may be deposited having a film thickness within a range from about 0.1 nm to about 30 nm, preferably, from about 0.5 nm to about 20 nm, and more preferably, from about 1 nm to about 10 nm.

During steps 614-620, hafnium silicon oxynitride layer 710, or another high-k dielectric layer, is formed on or over aluminum oxide layer 708 by a vapor deposition process, such as ALD, CVD, PVD, thermal techniques, nitridation processes, or combinations thereof. In one embodiment, a hafnium silicate layer is deposited on or over aluminum oxide layer 708 during step 614, substrate 700 is exposed to a PDA process during step 616, the hafnium silicate layer is exposed to a nitridation process to form hafnium silicon oxynitride layer 710 during step 618, and subsequently, substrate 700 is exposed to a PNA process during step 620.

In certain embodiments, the hafnium silicate layer and hafnium silicon oxynitride layer 710 may be deposited or formed in part or in whole by CVD or ALD processes and apparatuses as described in commonly assigned U.S. Ser. Nos. 11/127,767 and 11/127,753, both filed May 12, 2005, and published as US 2005-0271813 and US 2005-0271812, which are incorporated herein by reference in their entirety for the purpose of describing methods and apparatuses used during ALD processes. Hafnium silicon oxynitride layer 710 is generally deposited or formed having a film thickness within a range from about 0.5 nm to about 30 nm, preferably, from about 1 nm to about 20 nm, and more preferably, from about 1 nm to about 8 nm.

Hafnium silicon oxynitride layer 710 is deposited on substrate 700 and may have a variety of stoichiometries or compositions that are homogenous, heterogeneous, graded, or multiple layered stacks or laminates. Hafnium silicon oxynitride layer 710 is generally a high-k dielectric material and may include combinations of hafnium, zirconium, titanium, tantalum, lanthanum, aluminum, silicon, oxygen, and/or nitrogen.

In an alternative embodiment, a high-k dielectric layer may be deposited of formed in place of hafnium silicon oxynitride layer 710. The high-k dielectric layer may have a composition that includes hafnium-containing materials, such as hafnium oxides ($HfO_x$ or $HfO_2$), hafnium silicates ($HfSi_xO_y$ or $HfSiO_4$), hafnium silicon oxynitrides ($HfSi_xO_yN_z$), hafnium oxynitrides ($HfO_xN_y$), hafnium aluminates ($HfAl_xO_y$), hafnium aluminum silicates ($HfAl_xSi_yO_z$), hafnium aluminum silicon oxynitrides ($HfAl_wSi_xO_yN_z$), hafnium lanthanum oxides ($HfLa_xO_y$), zirconium-containing materials, such as zirconium oxides ($ZrO_x$ or $ZrO_2$), zirconium silicates ($ZrSi_xO_y$ or $ZrSiO_4$), zirconium silicon oxynitrides ($ZrSi_xO_yN_z$), zirconium oxynitrides ($ZrO_xN_y$), zirconium aluminates ($ZrAl_xO_y$), zirconium aluminum silicates ($ZrAl_xSi_yO_z$), zirconium aluminum silicon oxynitrides ($ZrAl_wSi_xO_yN_z$), zirconium lanthanum oxides ($ZrLa_xO_y$), other aluminum-containing materials or lanthanum-containing materials, such as aluminum oxides ($Al_2O_3$ or $AlO_x$), aluminum oxynitrides ($AlO_xN_y$), aluminum silicates ($AlSi_xO_y$), aluminum silicon oxynitrides ($AlSi_xO_yN_z$), lanthanum aluminum oxides ($LaAl_xO_y$), lanthanum oxides ($LaO_x$ or $La_2O_3$), derivatives thereof, and combinations thereof. Other dielectric materials useful for high-k dielectric layer 412 may include titanium oxides ($TiO_x$ or $TiO_2$), titanium oxynitrides ($TiO_xN_y$), tantalum oxides ($TaO_x$ or $Ta_2O_5$) and tantalum oxynitrides ($TaO_xN_y$). Laminate films that are useful dielectric materials for a high-k dielectric layer and include $HfO_2/Al_2O_3$, $HfO_2/SiO_2$, $La_2O_3/Al_2O_3$, and $HfO_2/SiO_2/Al_2O_3$.

In certain embodiments, a hafnium silicate layer is deposited by a MO-CVD process conducted within a processing chamber, for example, processing chamber 214B. The processing chamber may have an internal pressure within a range from about 1 Torr to about 100 Torr, preferably, from about 1 Torr to about 20 Torr, and more preferably, from about 3 Torr to about 4 Torr. The substrate is usually heated to a temperature within a range from about 70° C. to about 1,000° C., preferably, from about 100° C. to about 750° C., and more preferably, from about 550° C. to about 700° C. during the MO-CVD process. In one embodiment, a hafnium precursor is introduced into the processing chamber at a rate within a range from about 5 mg/min to about 20 mg/min. The hafnium precursor is usually introduced with a carrier gas, such as nitrogen, having a total flow rate within a range from about 50 sccm to about 1,000 sccm.

In one example, the hafnium silicate layer is deposited by a MO-CVD process by exposing substrate 700 to a deposition gas containing a hafnium precursor (e.g., an alkylamido hafnium compound), a silicon precursor (e.g., an alkylamido silane), an oxygen precursor or oxidizing gas, and a carrier gas. The hafnium precursor is preferably TDEAH, the silicon precursor (Tris-DMAS), and in-situ water vapor produced by a water vapor generator (WVG) system, available from Fujikin of America, Inc., located in Santa Clara, Calif. The substrate is exposed to the deposition gas containing TDEAH, Tris-DMAS, water vapor, and at least one carrier gas, such as argon. The hafnium silicate layer may be deposited to a thickness within a range from about 1 nm to about 8 nm.

In one embodiment, at step 616, substrate 700 may be optionally exposed to a PDA process. Substrate 700 containing the hafnium silicate layer is transferred to annealing chamber 214D, such as the CENTURA® RADIANCE® RTP chamber available from Applied Materials, Inc., located in Santa Clara, Calif. and exposed to the PDA process. Substrate 700 may be heated to a temperature within a range from about 500° C. to about 1,200° C., preferably, from about 550° C. to about 1,100° C., and more preferably, from about 600° C. to about 1,000° C. The PDA process may last for a time period within a range from about 1 second to about 5 minutes, preferably, from about 1 minute to about 4 minutes, and more preferably from about 2 minutes to about 3 minutes. Generally, the chamber atmosphere contains at least one annealing gas, such as oxygen ($O_2$), ozone ($O_3$), atomic oxygen (O), water ($H_2O$), nitric oxide (NO), nitrous oxide ($N_2O$), nitrogen dioxide ($NO_2$), dinitrogen pentoxide ($N_2O_5$), nitrogen ($N_2$), ammonia ($NH_3$), hydrazine ($N_2H_4$), derivatives thereof, or combinations thereof. Often the annealing gas contains nitrogen and at least one oxygen precursor gas, such as oxygen. The chamber may have a pressure within a range from about 5 Torr to about 100 Torr, for example, about 10 Torr. In one example of a PDA process, the substrate containing the hafnium silicate layer is heated to a temperature of about 600° C. for about 4 minutes within an oxygen atmosphere. The hafnium silicate layer may have a film thickness within a range from about 0.5 nm to about 30 nm, preferably, from about 1 nm to about 10 nm, and more preferably, from about 1 nm to about 8 nm.

Substrate 700 containing the hafnium silicate layer may subsequently be exposed to a plasma nitridation process at step 618 and another annealing process at step 620 to form hafnium silicon oxynitride layer 710. In one example, substrate 700 is transferred into DPN chamber 214C, such as the CENTURA® DPN chamber, available from Applied Materials, Inc., located in Santa Clara, Calif., where a DPN process is performed at step 618. The plasma nitridation process exposes the hafnium silicate layer to nitrogen plasma and incorporates nitrogen into the hafnium silicate layer to form a nitrided hafnium silicate layer or hafnium silicon oxynitride layer 710.

At step 620, substrate 700 containing hafnium silicon oxynitride layer 710 may be exposed to a PNA process. In one example, substrate 700 is transferred to annealing chamber 214D, such as the CENTURA® RADIANCE® RTP chamber available from Applied Materials, Inc., located in Santa Clara, Calif., and exposed to the thermal annealing process. Substrate 700 may be heated to a temperature within a range from about 500° C. to about 1,200° C., preferably, from about 550° C. to about 1,100° C., and more preferably, from about 600° C. to about 1,000° C. The PNA process may last for a time period within a range from about 1 second to about 120 seconds, preferably, from about 2 seconds to about 60 seconds, and more preferably, from about 5 seconds to about 30 seconds. Generally, the chamber atmosphere contains at least one annealing gas, such as oxygen, ozone, atomic oxygen, water, nitric oxide, nitrous oxide, nitrogen dioxide, dinitrogen pentoxide, nitrogen, ammonia, hydrazine, derivatives thereof, or combinations thereof. Often the annealing gas may contain nitrogen and at least one oxygen precursor gas, such as oxygen. The chamber may have an internal chamber pressure within a range from about 5 Torr to about 100 Torr, for example, about 10 Torr.

The PNA process at step 620 may repair any damage caused by plasma bombardment during the plasma nitridation process at step 618 and reduces the fixed charge of post anneal layer. Hafnium silicon oxynitride layer 710 may have a nitrogen concentration within a range from about 5 at % to about 25 at %, preferably, from about 10 at % to about 20 at %, for example, about 15 at %. Hafnium silicon oxynitride layer 710 may have a film thickness within a range from about 0.1 nm to about 30 nm, preferably, from about 0.5 nm to about 10 nm, and more preferably, from about 1 nm to about 8 nm.

During step 622, aluminum oxide layer 712 may be deposited or formed on or over hafnium silicon oxynitride layer 710 by a vapor deposition process, such as ALD, CVD, or PVD. In one example, aluminum oxide layer 712 is deposited by sequentially exposing substrate 700 to an aluminum precursor and an oxygen precursor during an ALD. Aluminum oxide layer 712 may be deposited having a film thickness within a range from about 0.1 nm to about 30 nm, preferably, from about 0.5 nm to about 20 nm, and more preferably, from about 1 nm to about 10 nm.

At step 624, polysilicon layer 714, such as a control gate polysilicon layer, is deposited on or over aluminum oxide layer 712. In one example, polysilicon layer 714 may be formed in a deposition chamber such as LP-CVD deposition chamber 214A or ALD chamber 214B of integrated processing system 200 (FIG. 2). In an alternative embodiment, instead of a polysilicon material, an amorphous silicon material or other suitable conductive material may be substituted for polysilicon layer 714. Further, metals such as titanium, titanium nitride, tantalum, tantalum nitride, tungsten, tungsten nitride, and other refractory metals or other suitable electrode materials may be deposited thereover. After the formation of polysilicon layer 714, the gate stack may be transferred to a cool down chamber and then transferred to a storage area such as load locks 206A and 206B for further processing, testing, or other processes known in the art.

It is to be appreciated that the gate stack that includes the gate dielectric film and the polysilicon cap film may be formed in several processing chambers not necessarily incorporated into integrated processing system 200 previously described.

Examples provide floating gate polysilicon layer 704 may be deposited on or over substrate surface 702 during step 604 and depicted in FIG. 7A. Silicon oxynitride layer 706 may be formed on substrate 600 during steps 606, 608, and 610, as depicted in FIG. 7B. In one example, a silicon oxide layer may be formed or deposited on or over floating gate polysilicon layer 704 during step 606 by oxidizing a portion of floating gate polysilicon layer 704 with an oxidizer, such as ozone or an oxygen plasma. In another example, a silicon oxide layer may be formed or deposited on or over floating gate polysilicon layer 704 during step 606 by a CVD process or an ALD process utilizing a silicon precursor and an oxidizer or oxygen precursor, such as ozone, an oxygen plasma, water vapor, or oxygen. The silicon oxide layer may be exposed a nitridation process during step 608, such as a PNA process to form silicon oxynitride layer 706. Silicon oxynitride layer 706 may have a nitrogen concentration within a range form about 5 at % to about 50 at %. Thereafter, substrate 700 may be heated during an annealing process at step 610, such as being exposed to a RTP. During step 612 and depicted in FIG. 7C, aluminum oxide layer 708 is deposited on or over silicon oxynitride layer 706 by an ALD process. A hafnium silicate layer may be deposited on or over aluminum oxide layer 708 by a MO-CVD process during step 614. Substrate 600 may be exposed to a post deposition annealing process, such as a RTP, during step 616. Subsequently, the hafnium silicate layer is exposed to a PNA process to form hafnium silicon oxynitride layer 710 during step 618 and then exposed to a RTP at step 620. At step 622, aluminum oxide layer 712 is deposited by an ALD process on or over hafnium silicon oxynitride layer 710. Control polysilicon layer 714 is deposited on or over aluminum oxide layer 712 during step 624.

Oxygen precursors or oxidizing agents may be used to form silicon oxide materials (e.g., step 606), aluminum oxide materials (e.g., steps 612 and 622), and hafnium-containing materials, such as hafnium oxide, hafnium silicate, hafnium oxynitride, hafnium silicon oxynitride (e.g., steps 614 and 618) and in annealing processes (e.g., steps 610, 616, and 620). Examples of suitable oxygen precursors or oxidizing agents include atomic oxygen (O), oxygen ($O_2$), ozone ($O_3$), water ($H_2O$), hydrogen peroxide ($H_2O_2$), organic peroxides, alcohols, nitrous oxide ($N_2O$), nitric oxide (NO), nitrogen dioxide ($NO_2$), dinitrogen pentoxide ($N_2O_5$), plasmas thereof, radicals thereof, derivatives thereof, or combinations thereof. In one embodiment, in-situ water vapor is used as an oxygen precursor and may be produced by a water vapor generator (WVG) system, available from Fujikin of America, Inc., located in Santa Clara, Calif. In certain embodiments, an oxygen precursor may be formed by combining ozone and water to provide a strong oxidizing agent. The oxygen precursor generally contains hydroxyl radicals (OH) which have strong oxidizing power. The ozone concentration may vary relative to the water concentration. A molar ratio of ozone to water ratio may be within a range from about 0.01 to about 30, preferably, from about 0.03 to about 3, and more preferably, from about 0.1 to about 1.

Silicon precursors may be used to form poly-silicon materials (e.g., steps 604 and 624), silicon oxide materials (e.g., step 606), silicon oxynitride materials (e.g., step 608), silicon nitride materials, and hafnium-containing materials, such as hafnium silicate, hafnium silicon nitride, or hafnium silicon oxynitride (e.g., steps 614 and 618). Examples of suitable silicon precursors include silanes, alkylsilanes, halosilanes, alkoxysilanes, amidosilanes, amidodisilanes, silylazides, silylhydrazines, or derivatives thereof. Some specific examples of silicon precursors include silane ($SiH_4$), disilane ($Si_2H_6$), trisilane ($Si_3H_8$), methylsilane ($CH_3SiH_3$), bis(tert-butylamido)silane (BTBAS or ($^tBu(H)N)_2SiH_2$), hexachlorodisilane (HCD or $Si_2Cl_6$), tetrachlorosilane ($SiCl_4$), dichlorosilane ($H_2SiCl_2$), 1,2-diethyltetrakis(diethylamido)disilane (($CH_2CH_3((CH_3CH_2)_2N)_2Si)_2$), 1,2-dichlorotetrakis(diethylamido)disilane (($Cl((CH_3CH_2)_2N)_2Si)_2$), hexakis(N-pyrrolidinio)disilane ((($C_4H_9N)_3Si)_2$), 1,1,2,2-tetrachloro-bis(di(trimethyl silyl)amido)disilane, (($Cl_2((CH_3)_3Si)_2N)Si)_2$), 1,1,2,2-tetrachloro-bis(diisopropylamido)disilane, (($Cl_2((C_2H_7)_2N)Si)_2$), 1,2-dimethyltetrakis(diethylamido)disilane (($CH_3(CH_3CH_2N)_2Si)_2$), tris(dimethylamido)silane azide ((($CH_3)_2N)_3SiN_3$), tris(methylamido)silane azide ((($CH_3)(H)N)_3SiN_3$), 2,2-dimethylhydrazine-dimethylsilane (($CH_3)_2(H)Si)(H)NN(CH_3)_2$), trisilylamine (($SiH_3)_3N$ or TSA), and hexakis(ethylamido)disilane ((($EtHN)_3Si)_2$), radicals thereof, plasmas thereof, derivatives thereof, or combinations thereof.

In certain embodiments, an alkoxysilane compound may be used as a silicon precursor. The alkoxysilane may have the chemical formula $(RO)_nSiR'_{(4-n)}$, wherein n=1, 2, 3, or 4, each R, independently, may be methyl, ethyl, propyl, butyl, or other alkyl group, and each R', independently, may be hydrogen, a halogen group, methyl, ethyl, propyl, butyl, or other alkyl group. Examples of alkoxysilane compounds that may be used as silicon precursors include tetraethoxysilane (($EtO)_4Si$ or TEOS), tetramethoxysilane (($MeO)_4Si$), tetrapropoxysilane (($PrO)_4Si$), tetraisopropoxysilane (($^iPrO)_4Si$), tetrabutoxysilane (($BuO)_4Si$), triethoxysilane (($EtO)_3SiH$), diethoxysilane (($EtO)_2SiH_2$), diethoxydimethylsilane (($EtO)_2SiMe_2$), diethoxydiethylsilane (($EtO)_2SiEt_2$), dimethoxydiethoxsilane (($MeO)_2Si(OEt)_2$), derivatives thereof, or combinations thereof.

Figure 8:
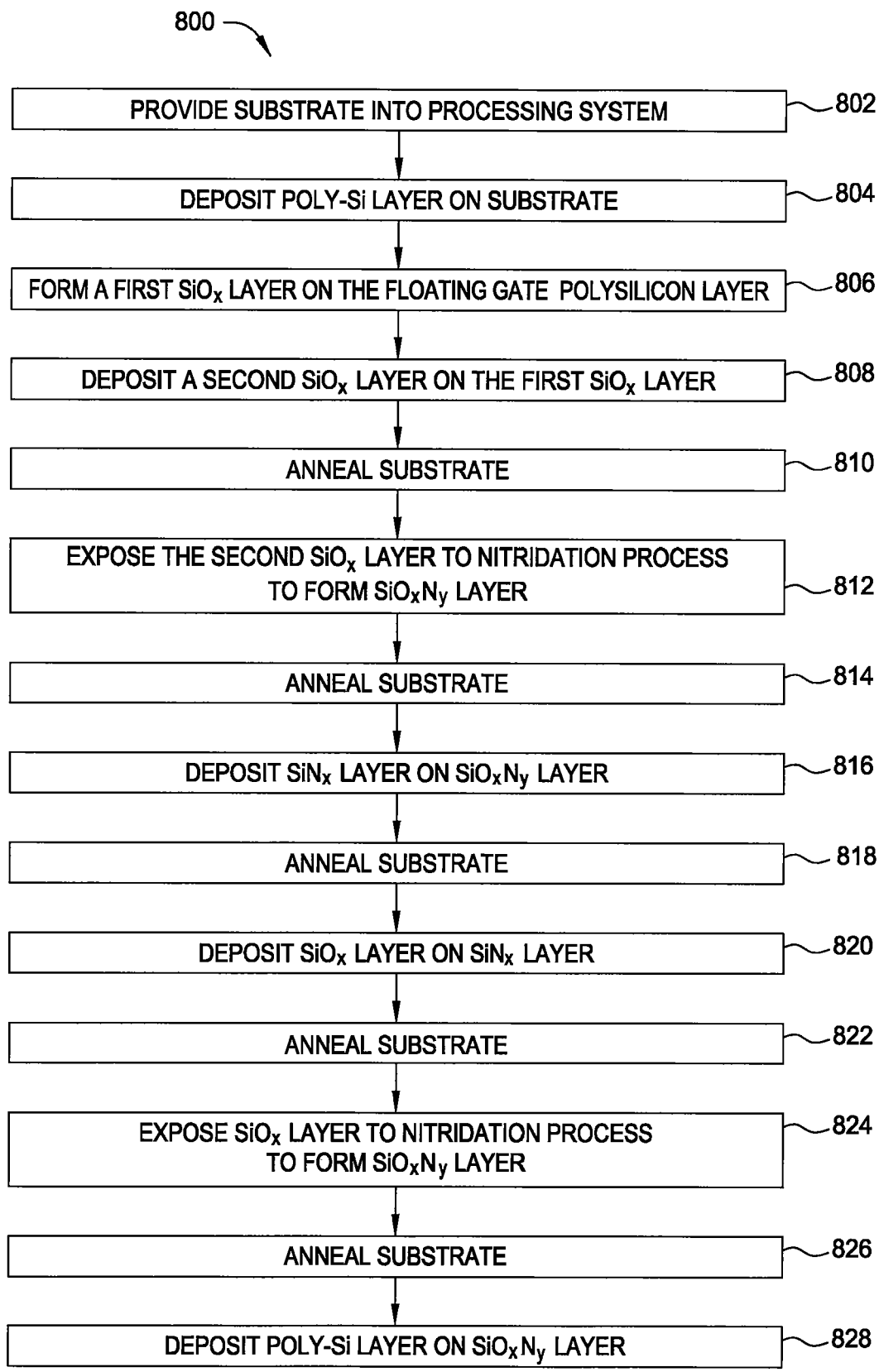
FIG. 8 depicts a process flow diagram of another deposition process according to another embodiment described herein.
Figure 9:
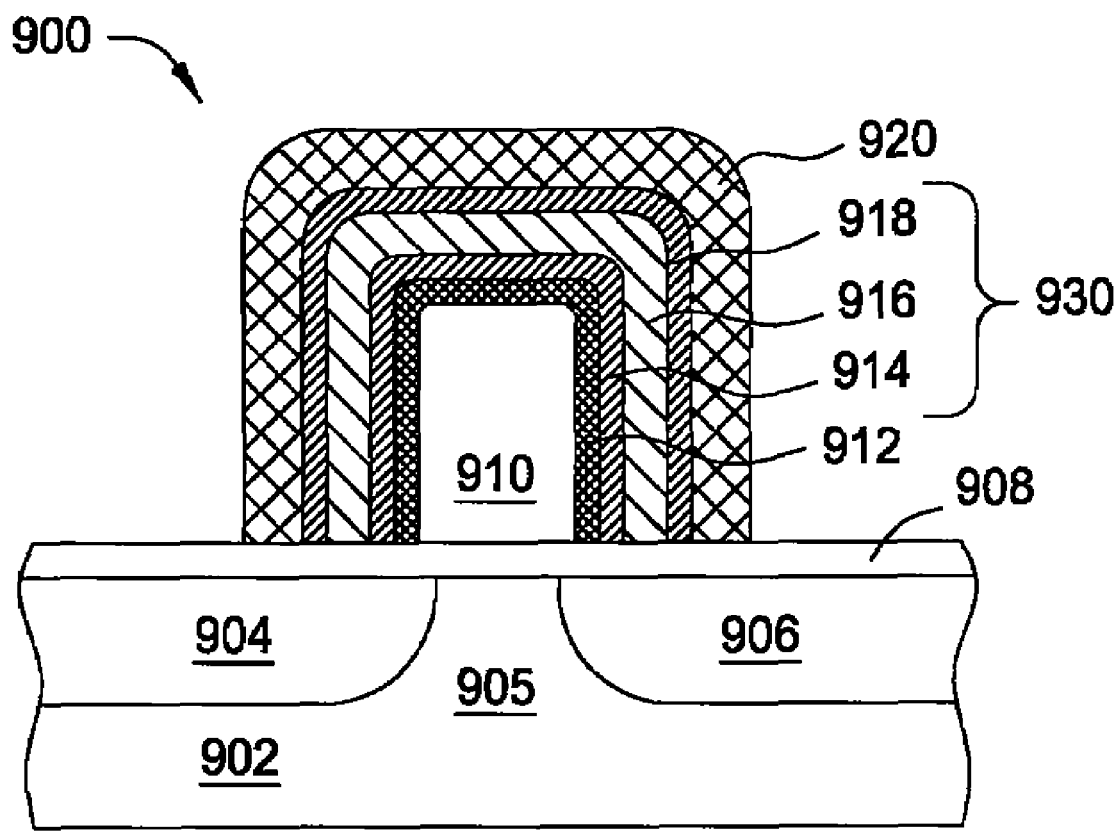
FIG. 9 depicts a schematic cross-sectional view of a substrate in accordance with another embodiment described herein.

In another embodiment, FIG. 8 depicts a process flow diagram of process 800. In one example, process 800 may be performed on processing system 200, as illustrated in FIG. 2. It is also contemplated that process 800 may be performed in other processing chambers and systems. FIG. 9 depicts a schematic cross-sectional view of substrate 900 that may be formed during the processing steps of process 800, in accordance with embodiments described herein.

In one embodiment, FIG. 9 depicts a two dimensional block diagram of a flash memory cell on substrate 900. Substrate 900 includes source/drain regions 904 and 906 located in semiconductor layer 902 and separated by channel region 905. Oxide layer 908, for example, a silicon dioxide layer, or tunnel dielectric overlies channel region 905. Floating gate 910 or a first polysilicon layer overlies oxide layer 908. In one embodiment, oxide layer 912 is disposed on or over floating gate 910. In an alternative embodiment, the oxide layer is omitted and inter-poly dielectric stack 930 is disposed on or over floating gate 910. Control gate 920 or a second polysilicon layer overlies floating gate 910 and is separated therefrom by inter-poly dielectric stack 930 containing oxynitride layer 914 and oxynitride layer 918 with silicon oxynitride layer 916 therebetween.

During step 802 of process 800, substrate 900 may be positioned within a processing chamber which is part of a processing system. Substrate 900 may already contain oxide layer 908 disposed over source/drain regions 904 and 906 and channel region 905 of semiconductor layer 902. Floating gate polysilicon layer 910 may be deposited on oxide layer 908 over source/drain regions 904 and 906 and channel region 905 during step 804. Subsequently, at step 806, silicon oxide layer 912 may be formed on or over floating gate polysilicon layer 910. In one example, silicon oxide layer 912 may be formed by performing a re-oxidation of material from floating gate polysilicon layer 910 during a rapid thermal oxidation process.

Silicon oxynitride layer 914 may be formed on substrate 900 during steps 808, 810, 812, and 814. For example, a silicon oxide layer may be deposited on or over silicon oxide layer 912 at step 808, annealed at step 810, exposed a nitridation process to form silicon oxynitride layer 914 at step 812, and heated during an annealing process at step 814. In one example, the silicon oxide layer may be deposited during an ALD process (step 808), exposed to a PDA process (step 810), exposed to a DPN process (step 812), and exposed to a PNA (step 814).

During step 816, silicon nitride layer 916 may be deposited on or over silicon oxynitride layer 914. Substrate 900 may be exposed to a thermal annealing process at step 818. In one example, silicon nitride layer 916 may be deposited during an ALD process and substrate 900 annealed during a PDA process.

Thereafter, silicon oxynitride layer 918 may be formed on substrate 900 during steps 820, 822, 824, and 826. For example, a silicon oxide layer may be deposited on or over silicon oxynitride layer 914 at step 820, annealed at step 822, exposed a nitridation process to form silicon oxynitride layer 918 at step 824, and heated during an annealing process at step 826. In one example, the silicon oxide layer may be deposited during an ALD process (step 820), exposed to a PDA process (step 822), exposed to a DPN process (step 824), and exposed to a PNA (step 826). Control polysilicon layer 920 may be deposited on or over silicon oxynitride layer 918 during step 828.

Process 800 begins at step 802 by positioning substrate 900 to a processing chamber, for example, processing chamber 214A integrated into the system 200 described above. Substrate 900 refers to any substrate or material surface upon which film processing is performed. For example, substrate 900 and/or semiconductor layer 902 may be a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, sapphire, or other suitable workpieces. Substrate 900 may have various dimensions, such as 200 mm, 600 mm diameter, or 450 mm wafers, as well as, rectangular or square panels. Unless otherwise noted, embodiments and examples described herein are conducted on substrates with a 200 mm diameter, a 300 mm diameter, or a 450 mm diameter. In certain embodiments, substrate 900 may include an inter-poly dielectric film stack disposed thereon including a high-k material that may be suitable for non-volatile flash memory devices.

Prior to transferring substrate 900 into the processing chamber, a precleaning process may be performed to the upper surface of substrate 900. The precleaning process exposes substrate 900 to reagents to produce a surface containing the desirable functional group. Functional groups attached and/or formed on the surface of substrate 900 include hydroxyls (OH), alkoxy (OR, where R=Me, Et, Pr, or Bu), haloxyls (OX, where X=F, Cl, Br, or I), halides (F, Cl, Br, or I), oxygen radicals and amidos (NR or $NR_2$, where R=H, Me, Et, Pr, or Bu). The precleaning process may expose substrate 900 to a reagent, such as $NH_3$, $B_2H_6$, $SiH_4$, $Si_2H_6$, $H_2O$, HF, HCl, $O_2$, $O_3$, $H_2O_2$, $H_2$, atomic-H, atomic-N, atomic-O, alcohols, amines, plasmas thereof, derivatives thereof, or combinations thereof. The functional groups may provide a base for an incoming chemical precursor to attach on the upper surface of substrate 900. In certain embodiments, the precleaning process may expose the upper surface of substrate 900 to a reagent for a period from about 1 second to about 2 minutes. In certain embodiments, the exposure period may be from about 5 seconds to about 60 seconds. Precleaning processes may also include exposing the surface of substrate 900 to an RCA solution (SC1/SC2), an HF-last solution, peroxide solutions, acidic solutions, basic solutions, plasmas thereof, derivatives thereof or combinations thereof. Useful precleaning processes are described in commonly assigned U.S. Pat. No. 6,858,547 and U.S. Ser. No. 10/302,752, filed Nov. 21, 2002, and published as US 2003/0232501, which are both incorporated herein by reference in their entirety.

In certain embodiments where a wet-clean process is performed to clean the substrate surface, the wet-clean process may be performed in a MARINER™ wet-clean system or a TEMPEST™ wet-clean system, available from Applied Materials, Inc. Alternatively, substrate 900 may be exposed to water vapor derived from a WVG system for about 15 seconds.

At step 804, polysilicon layer 910, such as a floating gate polysilicon layer, is deposited on substrate 900. Polysilicon layer 910 may be deposited using a LP-CVD process or other suitable processes for depositing a polysilicon layer. Polysilicon layer 910 may function as a floating gate for storing electrical charge. Polysilicon layer 910 is generally deposited having a film thickness within a range from about 50 nm to about 400 nm, preferably, from about 100 nm to about 600 nm, and more preferably, from about 150 nm to about 200 nm. In one example, polysilicon layer 910 may be deposited while the interior of the processing chamber is at a temperature of about 720° C. and a pressure of about 275 Torr.

Silicon oxide layer 912 may be deposited on substrate 900 using a vapor deposition process, such as CVD or ALD, or by a rapid thermal oxidation (RTO) process during step 806. In one embodiment, at step 806, silicon oxide layer 912 is deposited on polysilicon layer 910, such as a floating gate polysilicon layer, using RTO techniques. In one example, silicon oxide layer 912 contains a silicon oxide material grown using a reduced pressure RTP chamber such as the RTP chamber 216 of integrated processing system 200. The silicon oxide material may be formed by a RTO process, which is an oxidation process where the chamber uses lamps to quickly heat and dry a substrate surface (e.g., polysilicon layer 910) to form an oxidized layer in the presence of an oxidizing gas containing an oxygen precursor or oxidizer. The RTO of a silicon-containing substrate is carried out using a dry RTO process with the presence of an oxygen precursor or oxidizer, such as atomic-O, $O_2$, $O_2+N_2$, $O_2+Ar$, $H_2O+O_2$, $H_2O+O_3$, $H_2O+N_2O$, $N_2O$, $N_2O+N_2$, $O_3$, $O_3+H_2$, $O_3+Ar$, derivatives thereof, plasmas thereof, or combinations thereof. The oxidizing gas may have a total flow rate within a range from about 1 slm to about 5 slm. Alternatively, the RTO of a silicon substrate is carried out using a wet process such as in-situ steam generation (ISSG) with the presence of $O_2+H_2$, $O_2+H_2+N_2$, or $N_2O+H_2$ having, for example, a total flow rate within a range from about 1 slm to about 5 slm and a hydrogen concentration within a range from about 1% to about 13%. In certain embodiments, the RTO process used to form the silicon oxide dielectric film is performed at a processing temperature within a range from about 750° C. to about 1,000° C. and a processing pressure within a range from about 0.5 Torr to about 50 Torr for a time period within a range from about 5 seconds to about 90 seconds. Silicon oxide layer 912 may have a thickness within the range from about 0.1 nm to about 4 nm, preferably, from about 0.5 nm to about 3 nm, and more preferably, from about 1 nm to about 2 nm.

During steps 808, 810, 812, and 814, silicon oxynitride layer 914 may be formed on substrate 900 and is disposed on or over polysilicon layer 910 and silicon oxide layer 912. Silicon oxynitride layer 914 may be formed by depositing a silicon oxide layer (step 808), followed by exposing the silicon oxide layer to an annealing process (step 810), followed by exposing the silicon oxide layer to a plasma nitridation process (step 812), and subsequently, an annealing process (step 814). In step 808, the silicon oxide layer may be deposited using RTP, CVD, RT-CVD, PE-CVD, PVD, ALD, PE-ALD, ALE, derivatives thereof, or combinations thereof. Silicon oxynitride layer 914 is generally formed or deposited having a film thickness within a range from about 0.5 nm to about 30 nm, preferably, from about 1 nm to about 20 nm, and more preferably, from about 3 nm to about 8 nm.

In certain embodiments, deposition of the silicon oxide layer using an ALD process is achieved by exposing substrate 900 to an oxygen precursor gas (e.g., $O_3$ or $N_2O$) having a flow rate within a range from about 1,000 sccm to about 4,000 sccm, for example, about 3,000 sccm, nitrogen gas having a flow rate within a range from about 1,000 sccm to about 2,000 sccm, for example, about 1,800 sccm, and a silicon precursor gas (e.g., $SiH_4$) having a flow rate within a range from about 1 sccm to about 20 sccm, for example, about 4 sccm, at a temperature within a range from about 500° C. to about 1,000° C., for example, about 700° C., a pressure within a range from about 100 Torr to about 1,000 Torr, for example, about 275 Torr.

In certain embodiments, at step 808, the silicon oxide layer may be deposited on the substrate, such as on or over the underlying layers of silicon oxide or polysilicon. The silicon oxide layer may be formed by exposing the substrate to a deposition gas during a CVD process. The deposition gas contains may contain a silicon precursor and an oxygen precursor, or in another embodiment, a precursor containing both silicon and oxygen sources, such as an alkoxysilane. Alternatively, the deposition process may be an ALD process having at least two deposition gases, such that, the substrate is sequentially exposed to a silicon precursor and an oxygen precursor. Silicon oxide materials may have the chemical formula of $SiO_x$, wherein x is about 2 or less, for example, about 1.8. In one example, a silicon oxide layer is deposited by a LP-CVD process utilizing silane as a silicon precursor and ozone as an oxygen precursor. In one embodiment, an alkoxysilane compound (e.g., TEOS) may be used as a source for both silicon and oxygen, instead of separate silicon and oxygen precursors, to form a silicon oxide material during step 808.

A description of CVD and ALD processes and apparatuses that may be modified (e.g., incorporating a UV radiation source) and chemical precursors that may be useful for depositing silicon oxide materials, silicon nitride materials, and silicon oxynitride materials, are further disclosed in commonly assigned U.S. Pat. Nos. 6,869,838, 6,825,134, 6,905,939, and 6,924,191, and commonly assigned U.S. Ser. No. 09/964,075, filed Sep. 25, 2001, and published as US 2003-0059535, U.S. Ser. No. 10/624,763, filed Jul. 21, 2003, and published as US 2004-0018738, U.S. Ser. No. 10/794,707, filed Mar. 4, 2004, and published as US 2004-0175961, and U.S. Ser. No. 10/688,797, filed Oct. 17, 2003, and published as US 2004-0224089, which are all herein incorporated by reference in their entirety.

A carrier gas may be provided during step 808 to control the partial pressure of the oxygen precursor and the silicon precursor. The total internal pressure of a single wafer processing chamber may be at a pressure within a range from about 100 mTorr to about 740 Torr, preferably, from about 250 mTorr to about 400 Torr, and more preferably, from about 500 mTorr to about 200 Torr. In one example, the processing chamber may have an internal pressure of about 150 Torr or less, preferably, about 100 Torr or less, and more preferably, about 50 Torr or less. In some embodiments, the carrier gas may be provided to control the partial pressure of the nitrogen precursor or the silicon precursor within a range from about 100 mTorr to about 1 Torr for batch processing systems. Examples of suitable carrier gases include nitrogen, hydrogen, argon, helium, forming gas, or combinations thereof.

In one example, subsequent the deposition of silicon oxide layer within the ALD or LP-CVD chamber 214A, substrate 900 may be transferred to annealing chamber 214D, such as the XE, XE Plus, or RADIANCE® RTP chamber available from Applied Materials, Inc., located in Santa Clara, Calif., for a post deposition annealing of the silicon oxide layer during step 810. In one example, substrate 900 is exposed to an oxygen-containing atmosphere within the annealing chamber.

Subsequently, the silicon oxide layer on substrate 900 may be exposed to a plasma nitridation process during step 812. In one example, substrate 900 may be transferred into DPN chamber 214C of integrated processing system 200 under an inert (e.g., $N_2$ or Ar) environment with the transfer chamber pressure being approximately the same pressure for the plasma nitridation process. The plasma nitridation process at step 812 exposes the silicon oxide film to nitrogen plasma and incorporates nitrogen into silicon oxide material to form a silicon oxynitride material, silicon oxynitride layer 914. In one embodiment, DPN chamber 214C is a reduced pressure inductively coupled RF plasma reactor that can accommodate an inert gas such as $N_2$, He, or Ar. Process conditions are set to incorporate nitrogen into the silicon oxide material, forming silicon oxynitride layer 914. Silicon oxynitride layer 914 may have a nitrogen concentration within a range from about 5 at % to about 50 at%, preferably, from about 10 at % to about 20 at %.

Substrate 900 may be exposed to another PNA process during step 814. In one example, substrate 900 is transferred to annealing chamber 214D, such as the XE, XE Plus, or RADIANCE® RTP chamber available from Applied Materials, Inc., located in Santa Clara, Calif., for a post deposition annealing of silicon oxynitride layer 914 in an oxygen containing atmosphere. During step 814, substrate 900 is exposed to a RTP or PNA process. Substrate 900 may be heated to a temperature within a range from about 500° C. to about 1,200° C., preferably, from about 900° C. to about 1,100° C. for a time period within a range from about 1 second to about 240 seconds, preferably, from about 30 seconds to about 90 seconds, for example, about 1,000° C. for about 60 seconds. Generally, the annealing chamber atmosphere contains at least one anneal gas, such as $O_2$, $O_3$, $N_2$, $NH_3$, $N_2H_4$, NO, $N_2O$, or combinations thereof. The annealing chamber may have an internal pressure within a range from about 5 Torr to about 100 Torr, for example, about 50 Torr.

During step 816, silicon nitride layer 916 may be deposited on or over silicon oxynitride layer 914 by a vapor deposition process, such as ALD, CVD, or PVD. In one example, silicon nitride layer 916 is deposited by sequentially exposing substrate 900 to a silicon precursor and a nitrogen precursor during an ALD process. Silicon nitride layer 916 may be deposited having a film thickness within a range from about 0.5 nm to about 30 nm, preferably, from about 1 nm to about 20 nm, and more preferably, from about 1 nm to about 8 nm. At step 818, substrate 900 may be exposed to a thermal annealing process. In one example, substrate 900 is transferred to annealing chamber 214D, such as the XE, XE Plus, or RADIANCE® RTP chamber available from Applied Materials, Inc., located in Santa Clara, Calif., for a post deposition annealing of silicon nitride layer 916. Substrate 900 may be exposed to an atmosphere of a nitrogen precursor or other gas within the annealing chamber. The annealing chamber may contain nitrogen, ammonia, hydrogen, argon, or combinations thereof. In one example, substrate 900 is annealed in an atmosphere containing ammonia during step 818.

During steps 820, 822, 824, and 826, silicon oxynitride layer 918 may be formed on substrate 900 and is disposed on or over silicon nitride layer 916. Silicon oxynitride layer 918 may be formed by depositing a silicon oxide layer (step 820), followed by exposing the silicon oxide layer to an annealing process (step 822), followed by exposing the silicon oxide layer to a plasma nitridation process (step 824), and subsequently, an annealing process (step 826). In step 820, the silicon oxide layer may be deposited on or over silicon nitride layer 916 using RTP, conventional CVD, RT-CVD, PE-CVD, PVD, ALD, PE-ALD, ALE, derivatives thereof, or combinations thereof. The silicon oxide layer may be formed or deposited having a film thickness within a range from about 0.5 nm to about 30 nm, preferably, from about 1 nm to about 20 nm, and more preferably, from about 3 nm to about 8 nm.

In certain embodiments, deposition of the silicon oxide layer using an ALD process is achieved by exposing substrate 900 to an oxygen precursor gas (e.g., $O_3$ or $N_2O$) having a flow rate within a range from about 1,000 sccm to about 4,000 sccm, for example, about 3,000 sccm, nitrogen gas having a flow rate within a range from about 1,000 sccm to about 2,000 sccm, for example, about 1,800 sccm, and a silicon precursor gas (e.g., $SiH_4$) having a flow rate within a range from about 1 sccm to about 20 sccm, for example, about 4 sccm, at a temperature within a range from about 500° C. to about 1,000° C., for example, about 700° C., a pressure within a range from about 100 Torr to about 1,000 Torr, for example, about 275 Torr.

In certain embodiments, at step 820, the silicon oxide layer may be deposited on the substrate, such as on or over the underlying layers of silicon oxide or polysilicon. The silicon oxide layer may be formed by exposing the substrate to a deposition gas during a CVD process. The deposition gas contains may contain a silicon precursor and an oxygen precursor, or in another embodiment, a precursor containing both silicon and oxygen sources, such as an alkoxysilane. Alternatively, the deposition process may be an ALD process having at least two deposition gases, such that, the substrate is sequentially exposed to a silicon precursor and an oxygen precursor. Silicon oxide materials may have the chemical formula of $SiO_x$, wherein x is about 2 or less, for example, about 1.8. In one example, a silicon oxide layer is deposited by a LP-CVD process utilizing silane as a silicon precursor and ozone as an oxygen precursor. In one embodiment, an alkoxysilane compound (e.g., TEOS) may be used as a source for both silicon and oxygen, instead of separate silicon and oxygen precursors, to form a silicon oxide material during step 820.

A carrier gas may be provided during step 820 to control the partial pressure of the oxygen precursor and the silicon precursor. The total internal pressure of a single wafer processing chamber may be at a pressure within a range from about 100 mTorr to about 740 Torr, preferably, from about 250 mTorr to about 400 Torr, and more preferably, from about 500 mTorr to about 200 Torr. In one example, the processing chamber may have an internal pressure of about 150 Torr or less, preferably, about 100 Torr or less, and more preferably, about 50 Torr or less. In some embodiments, the carrier gas may be provided to control the partial pressure of the nitrogen precursor or the silicon precursor within a range from about 100 mTorr to about 1 Torr for batch processing systems. Examples of suitable carrier gases include nitrogen, hydrogen, argon, helium, forming gas, or combinations thereof.

In one example, subsequent the deposition of silicon oxide layer within the ALD or LP-CVD chamber 214A, substrate 900 may be transferred to annealing chamber 214D, such as the XE, XE Plus, or RADIANCE® RTP chamber available from Applied Materials, Inc., located in Santa Clara, Calif., for a post deposition annealing of the silicon oxide layer during step 822. In one example, substrate 900 is exposed to an oxygen-containing atmosphere within the annealing chamber.

Subsequently, the silicon oxide layer on substrate 900 may be exposed to a plasma nitridation process during step 824. In one example, substrate 900 may be transferred into DPN chamber 214C of integrated processing system 200 under an inert (e.g., $N_2$ or Ar) environment with the transfer chamber pressure being approximately the same pressure for the plasma nitridation process. The plasma nitridation process at step 824 exposes the silicon oxide film to nitrogen plasma and incorporates nitrogen into silicon oxide material to form a silicon oxynitride material, silicon oxynitride layer 918. In one embodiment, DPN chamber 214C is a reduced pressure inductively coupled RF plasma reactor that can accommodate an inert gas such as $N_2$, He, or Ar. Process conditions are set to incorporate nitrogen into the silicon oxide material, forming silicon oxynitride layer 918. Silicon oxynitride layer 918 may have a nitrogen concentration within a range from about 5 at % to about 50 at%, preferably, from about 10 at % to about 20 at %.

Substrate 900 may be exposed to another annealing process during step 826. In one example, substrate 900 is transferred to annealing chamber 214D, such as the XE, XE Plus, or RADIANCE® RTP chamber available from Applied Materials, Inc., located in Santa Clara, Calif., for a post deposition annealing of silicon oxynitride layer 918 in an oxygen containing atmosphere. During step 826, substrate 900 is exposed to a RTP or post nitridation annealing process. Substrate 900 may be heated to a temperature within a range from about 500° C. to about 1,200° C., preferably, from about 900° C. to about 1,100° C. for a time period within a range from about 1 second to about 240 seconds, preferably, from about 30 seconds to about 90 seconds, for example, about 1,000° C. for about 60 seconds. Generally, the annealing chamber atmosphere contains at least one anneal gas, such as $O_2$, $O_3$, $N_2$, $NH_3$, $N_2H_4$, NO, $N_2O$, or combinations thereof. The annealing chamber may have an internal pressure within a range from about 5 Torr to about 100 Torr, for example, about 50 Torr.

At step 828, polysilicon layer 714, such as a control gate polysilicon layer, is deposited on aluminum oxide layer 712. In one example, polysilicon layer 714 may be formed in a deposition chamber such as LP-CVD deposition chamber 214A or ALD chamber 214B of integrated processing system 200 (FIG. 2). In an alternative embodiment, instead of a polysilicon material, an amorphous silicon material or other suitable conductive material may be substituted for polysilicon layer 714. Further, metals such as titanium, titanium nitride, tantalum, tantalum nitride, tungsten, tungsten nitride, and other refractory metals or other suitable electrode materials may be deposited thereover. After the formation of polysilicon layer 714, the gate stack may be transferred to a cool down chamber and then transferred to a storage area such as load locks 206A and 206B for further processing, testing, or other processes known in the art.

It is to be appreciated that the gate stack that includes the gate dielectric film and the polysilicon cap film may be formed in several processing chambers not necessarily incorporated into integrated processing system 200 previously described.

Examples provide floating gate polysilicon layer 910 may be deposited on or over substrate 900 during step 804 and depicted in FIG. 9. Silicon oxide layer 912 may be formed or deposited on polysilicon layer 910 during step 806.

Silicon oxynitride layer 914 may be formed on substrate 900 during steps 808, 810, 812, and 814. A silicon oxide layer may be formed or deposited on or over floating gate polysilicon layer 910 during step 808 by oxidizing a portion of floating gate polysilicon layer 910 with an oxidizer, such as ozone or an oxygen plasma. In another example, a silicon oxide layer may be formed or deposited on or over floating gate polysilicon layer 910 during step 808 by a CVD process or an ALD process utilizing a silicon precursor and an oxidizer or oxygen precursor, such as ozone, an oxygen plasma, water vapor, or oxygen.

The silicon oxide layer may be exposed an annealing process during step 810, such as a PDA process. Thereafter, the silicon oxide layer may be exposed a nitridation process during step 812, such as a PNA process to form silicon oxynitride layer 914. Silicon oxynitride layer 914 may have a nitrogen concentration within a range form about 5 at % to about 50 at %, preferably, form about 10 at % to about 20 at %. Thereafter, substrate 900 may be heated during an annealing process at step 814, such as being exposed to a PNA, such as a RTP.

During step 816, silicon nitride layer 916 is deposited on or over silicon oxynitride layer 914. In one example, silicon nitride layer 916 is deposited by an ALD process. Thereafter, substrate 900 is exposed to a PDA process during step 818.

Silicon oxynitride layer 918 may be formed on substrate 900 during steps 820, 822, 824, and 826. A silicon oxide layer may be formed or deposited on or over silicon nitride layer 916 during step 820 by a vapor deposition process, such as a CVD process or an ALD process utilizing a silicon precursor and an oxidizer or oxygen precursor, such as ozone, an oxygen plasma, water vapor, or oxygen.

The silicon oxide layer may be exposed an annealing process during step 822, such as a PDA process. Thereafter, the silicon oxide layer may be exposed a nitridation process during step 824, such as a PNA process to form silicon oxynitride layer 918. Silicon oxynitride layer 918 may have a nitrogen concentration within a range form about 5 at % to about 50 at %, preferably, form about 10 at % to about 20 at %. Thereafter, substrate 900 may be heated during an annealing process at step 826, such as being exposed to a PNA, such as a RTP. Control polysilicon layer 920 may be deposited on or over silicon oxynitride layer 918 during step 828.

Oxygen precursors or oxidizing agents may be used to form silicon oxide materials (e.g., steps 806, 808, and 820), aluminum oxide materials, and hafnium-containing materials, such as hafnium oxide, hafnium silicate, hafnium oxynitride, hafnium silicon oxynitride, and in annealing processes (e.g., steps 810, 814, 818, 822, and 826). Examples of suitable oxygen precursors or oxidizing agents include atomic oxygen (O), oxygen ($O_2$), ozone ($O_3$), water ($H_2O$), hydrogen peroxide ($H_2O_2$), organic peroxides, alcohols, nitrous oxide ($N_2O$), nitric oxide (NO), nitrogen dioxide ($NO_2$), dinitrogen pentoxide ($N_2O_5$), plasmas thereof, radicals thereof, derivatives thereof, or combinations thereof. In one embodiment, in-situ water vapor is used as an oxygen precursor and may be produced by a water vapor generator (WVG) system, available from Fujikin of America, Inc., located in Santa Clara, Calif. In certain embodiments, an oxygen precursor may be formed by combining ozone and water to provide a strong oxidizing agent. The oxygen precursor generally contains hydroxyl radicals (OH) which have strong oxidizing power. The ozone concentration may vary relative to the water concentration. A molar ratio of ozone to water ratio may be within a range from about 0.01 to about 30, preferably, from about 0.03 to about 3, and more preferably, from about 0.1 to about 1.

Silicon precursors may be used to form poly-silicon materials (e.g., steps 804, and 828), silicon oxide materials (e.g., steps 806, 808, and 820), silicon oxynitride materials (e.g., steps 812 and 824), silicon nitride materials (e.g., step 816), and hafnium-containing materials, such as hafnium silicate, hafnium silicon nitride, or hafnium silicon oxynitride. Examples of suitable silicon precursors include silanes, alkylsilanes, halosilanes, alkoxysilanes, amidosilanes, amidodisilanes, silylazides, silylhydrazines, or derivatives thereof. Some specific examples of silicon precursors include silane ($SiH_4$), disilane ($Si_2H_6$), trisilane ($Si_3H_8$), methylsilane ($CH_3SiH_3$), bis(tertbutylamido)silane (BTBAS or ($^tBu(H)N)_2SiH_2$), hexachlorodisilane (HCD or $Si_2Cl_6$), tetrachlorosilane ($SiCl_4$), dichlorosilane ($H_2SiCl_2$), 1,2-diethyltetrakis(diethylamido)disilane (($CH_2CH_3((CH_3CH_2)_2N)_2Si)_2$), 1,2-dichlorotetrakis(diethylamido)disilane (($Cl((CH_3CH_2)_2N)_2Si)_2$), hexakis(N-pyrrolidinio)disilane ((($C_4H_9N)_3)Si)_2$), 1,1,2,2-tetrachloro-bis(di(trimethyl silyl)amido)disilane, (($Cl_2((CH_3)_3Si)_2N)Si)_2$), 1,1,2,2-tetrachloro-bis(diisopropylamido)disilane, (($Cl_2((C_2H_7)_2N)Si)_2$), 1,2-dimethyltetrakis(diethylamido)disilane (($CH_3(CH_3CH_2N)_2Si)_2$), tris(dimethylamido)silane azide ((($CH_3)_2N)_3SiN_3$), tris(methylamido)silane azide ((($CH_3)(H)N)_3SiN_3$), 2,2-dimethylhydrazine-dimethylsilane (($CH_3)_2(H)Si)(H)NN(CH_3)_2$), trisilylamine (($SiH_3)_3N$ or TSA), and hexakis(ethylamido)disilane ((($EtHN)_3Si)_2$), radicals thereof, plasmas thereof, derivatives thereof, or combinations thereof.

In certain embodiments, an alkoxysilane compound may be used as a silicon precursor. The alkoxysilane may have the chemical formula $(RO)_nSiR'_{(4-n)}$, wherein n=1, 2, 3, or 4, each R, independently, may be methyl, ethyl, propyl, butyl, or other alkyl group, and each R', independently, may be hydrogen, a halogen group, methyl, ethyl, propyl, butyl, or other alkyl group. Examples of alkoxysilane compounds that may be used as silicon precursors include tetraethoxysilane (($EtO)_4Si$ or TEOS), tetramethoxysilane (($MeO)_4Si$), tetrapropoxysilane (($PrO)_4Si$), tetraisopropoxysilane (($^iPrO)_4Si$), tetrabutoxysilane (($BuO)_4Si$), triethoxysilane (($EtO)_3SiH$), diethoxysilane (($EtO)_2SiH_2$), diethoxydimethylsilane (($EtO)_2SiMe_2$), diethoxydiethylsilane (($EtO)_2SiEt_2$), dimethoxydiethoxysilane (($MeO)_2Si(OEt)_2$), derivatives thereof, or combinations thereof.

While the foregoing is directed to embodiments of the invention, other and further embodiments of the invention may be devised without departing from the basic scope thereof, and the scope thereof is determined by the claims that follow.

The invention claimed is:

1. A method for fabricating a non-volatile memory device, comprising:
   depositing a floating gate polysilicon layer on a substrate;
   depositing a silicon oxynitride layer on the floating gate polysilicon layer;
   depositing a first aluminum oxide layer on the silicon oxynitride layer;
   depositing a hafnium silicon oxynitride layer on the first aluminum oxide layer;
   depositing a second aluminum oxide layer on the hafnium silicon oxynitride layer; and
   depositing a control gate polysilicon layer on the second aluminum oxide layer.

2. The method of claim 1, wherein depositing the silicon oxynitride layer further comprises:
   depositing a silicon oxide material on the floating gate polysilicon layer;
   implanting nitrogen into the silicon oxide material a during a plasma nitridation process; and
   heating the substrate to a temperature of about 700° C. or higher during a post nitridation annealing process.

3. The method of claim 2, wherein the nitrogen is implanted into the silicon oxide material to a nitrogen concentration within a range from about 10 atomic percent to about 50 atomic percent.

4. The method of claim 2, wherein the silicon oxynitride layer has a thickness within a range from about 0.5 nm and about 10 nm.

5. The method of claim 2, wherein depositing the silicon oxide material comprises exposing the substrate to a deposition gas comprising a silicon precursor and ozone.

6. The method of claim 2, wherein the temperature during the post nitridation annealing process is within a range from about 700° C. to about 1,000° C.

7. The method of claim 1, wherein each of the first and second aluminum oxide layers independently is deposited by an atomic layer deposition process, and each of the first and second aluminum oxide layers independently have a thickness within a range from about 0.5 nm and about 20 nm.

8. The method of claim 1, wherein depositing the hafnium silicon oxynitride layer further comprises:
   depositing a hafnium silicate material over the first aluminum oxide layer;
   implanting nitrogen into the hafnium silicate material a during a plasma nitridation process; and
   heating the substrate to a temperature of about 600° C. or higher during a post nitridation annealing process.

9. The method of claim 8, wherein the nitrogen is implanted into the hafnium silicate material to a nitrogen concentration within a range from about 10 atomic percent to about 20 atomic percent.

10. The method of claim 8, wherein the hafnium silicate material has a thickness within a range from about 0.5 nm and about 20 nm.

11. The method of claim 10, wherein the thickness is within a range from about 1 nm and about 8 nm.

12. The method of claim 11, wherein the hafnium silicate material is deposited by a metal-organic chemical vapor deposition process, and the temperature during the metal-organic chemical vapor deposition process is within a range from about 600° C. to about 1,000° C.

13. The method of claim 8, wherein the temperature during the post nitridation annealing process is within a range from about 600° C. to about 1,100° C.

14. A non-volatile memory device, comprising:
   a source region and a drain region disposed on a substrate;
   a floating gate polysilicon layer disposed over the source and drain regions;
   a silicon oxynitride layer disposed over the floating gate polysilicon layer;
   a first aluminum oxide layer disposed over the silicon oxynitride layer;
   a hafnium silicon oxynitride layer disposed over the first aluminum oxide layer;
   a second aluminum oxide layer disposed over the hafnium silicon oxynitride layer; and
   a control gate polysilicon layer disposed over the second aluminum oxide layer.

* * * * *